(12) United States Patent
Hong et al.

(10) Patent No.: US 12,089,458 B2
(45) Date of Patent: Sep. 10, 2024

(54) DISPLAY PANEL AND DISPLAY APPARATUS INCLUDING THE SAME

(71) Applicant: Samsung Display Co., Ltd., Yongin-si (KR)

(72) Inventors: Sungjin Hong, Yongin-si (KR); Joohee Jeon, Yongin-si (KR); Chungsock Choi, Yongin-si (KR); Gunhee Kim, Yongin-si (KR); Sunyoung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 517 days.

(21) Appl. No.: 17/450,752

(22) Filed: Oct. 13, 2021

(65) Prior Publication Data

US 2022/0285475 A1   Sep. 8, 2022

(30) Foreign Application Priority Data

Mar. 4, 2021   (KR) .......................... 10-2021-0028967

(51) Int. Cl.
*H10K 59/131*   (2023.01)
*H10K 59/121*   (2023.01)
*H10K 59/122*   (2023.01)

(52) U.S. Cl.
CPC ....... *H10K 59/131* (2023.02); *H10K 59/1213* (2023.02); *H10K 59/1216* (2023.02); *H10K 59/122* (2023.02)

(58) Field of Classification Search
CPC .............. H10K 59/121; H10K 59/122; H10K 59/1213; H10K 59/1216; H10K 59/131; H10K 59/65; H10K 77/10; G09G 3/3233
See application file for complete search history.

(56) References Cited

U.S. PATENT DOCUMENTS

| | | | |
|---|---|---|---|
| 8,896,800 B2 | 11/2014 | Park et al. | |
| 9,761,651 B2 | 9/2017 | Chang et al. | |
| 2014/0027726 A1* | 1/2014 | Choi | H10K 59/35 |
| | | | 438/34 |
| 2016/0370580 A1 | 12/2016 | Takada et al. | |
| 2020/0286972 A1* | 9/2020 | Seo | H10K 59/1213 |
| 2021/0036090 A1 | 2/2021 | Hong et al. | |

FOREIGN PATENT DOCUMENTS

| | | |
|---|---|---|
| CN | 112310170 A | 2/2021 |
| JP | 6035450 B2 | 11/2016 |
| KR | 10-2016-0117728 A | 10/2016 |
| KR | 10-1998096 B1 | 7/2019 |
| KR | 10-2020-0000856 A | 1/2020 |

* cited by examiner

*Primary Examiner* — Brook Kebede

(74) *Attorney, Agent, or Firm* — Lewis Roca Rothgerber Christie LLP

(57) ABSTRACT

A display panel includes a main display area, a component area, and a peripheral area includes a substrate, a main pixel circuit and a main display element connected to the main pixel circuit, the main pixel circuit and the main display element being located on the substrate at the main display area, an auxiliary display element located on the substrate at the component area; an auxiliary pixel circuit located on the substrate at the peripheral area; a connection wiring connecting the auxiliary display element to the auxiliary pixel circuit; and a first conductive layer overlapping the auxiliary display element at the component area, the first conductive layer including a plurality of first holes.

24 Claims, 23 Drawing Sheets

DISPLAY PANEL AND DISPLAY APPARATUS INCLUDING THE SAME

CROSS-REFERENCE TO RELATED APPLICATION

This application claims priority to and the benefit of Korean Patent Application No. 10-2021-0028967, filed on Mar. 4, 2021, in the Korean Intellectual Property Office (KIPO), the entire disclosure of which is incorporated by reference herein.

BACKGROUND

1. Field

One or more embodiments relate to a display apparatus and electronic equipment, and more particularly, to a display apparatus capable of providing a high-quality image and improving the quality of an image output through a component.

2. Description of the Related Art

In general, a display apparatus includes a display element and electronic devices for controlling an electrical signal applied to the display element. The electronic devices include a thin-film transistor (TFT), a storage capacitor, and a plurality of wirings.

Recently, display apparatuses have been used for various purposes. Also, as thicknesses and weights of display apparatuses have decreased, the range of applications of display apparatuses has increased. As the range of applications of display apparatuses has increased, various methods have been studied to design shapes of the display apparatuses.

SUMMARY

A related art display panel and a display apparatus including the same may have quality that is degraded during an image-capturing operation using a camera in a design process for displaying a high-quality image.

Aspects of one or more embodiments of the present disclosure are directed toward a display apparatus capable of providing a high-quality image and improving the quality of an image output through a component. However, the embodiments are examples, and the present disclosure is not limited thereto.

Additional aspects will be set forth in part in the description which follows and, in part, will be apparent from the description, or may be learned by practice of the presented embodiments.

According to one or more embodiments, a display panel including a main display area, a component area, and a peripheral area includes a substrate, a main pixel circuit and a main display element connected to the main pixel circuit, the main pixel circuit and the main display element being located on the substrate at the main display area, an auxiliary display element located on the substrate at the component area, an auxiliary pixel circuit located on the substrate at the peripheral area, a connection wiring connecting the auxiliary display element to the auxiliary pixel circuit, and a first conductive layer overlapping the auxiliary display element at the component area, the first conductive layer including a plurality of first holes.

The auxiliary display element may include an auxiliary pixel electrode. The first conductive layer may be located between the substrate and the connection wiring.

An orthogonal projection image of the first conductive layer onto the substrate may completely overlap the auxiliary pixel electrode.

An area of the first conductive layer may be equal to or less than an area of the auxiliary pixel electrode.

The main pixel circuit may include a thin-film transistor including a semiconductor layer, a gate electrode, and an electrode layer connected to the semiconductor layer, and a storage capacitor including a lower electrode integrally formed with the gate electrode and an upper electrode located on the lower electrode. The first conductive layer includes a same material as a material of the gate electrode or the upper electrode.

The display panel may further include a second conductive layer located between the substrate and the auxiliary display element at the component area, the second conductive layer including a plurality of second holes.

The second conductive layer may be located on the first conductive layer.

The main pixel circuit may include a thin-film transistor including a semiconductor layer, a gate electrode, and an electrode layer connected to the semiconductor layer, and a storage capacitor including a lower electrode integrally formed with the gate electrode and an upper electrode located on the lower electrode. The first conductive layer includes a same material as a material of the gate electrode.

The second conductive layer includes a same material as a material of the upper electrode.

The first conductive layer and the second conductive layer may be electrically connected to each other.

The first conductive layer may be electrically connected to the connection wiring.

A width of each of the plurality of first holes in a direction may be equal to or greater than 0.5 µm.

An area of the plurality of first holes may be equal to or less than 50% of an area of the first conductive layer.

The plurality of first holes may have at least one of polygonal shapes, circular shapes, elliptical shapes, or irregular shapes, the plurality of first holes may be regularly arranged.

The plurality of first holes may have at least one of polygonal shapes, circular shapes, elliptical shapes, or irregular shapes, the plurality of first holes may be irregularly arranged.

The plurality of first holes may have stripe shapes extending in a direction.

According to one or more embodiments, a display panel including a main display area, a component area, and a peripheral area includes a substrate, a main pixel circuit and a main display element connected to the main pixel circuit, the main pixel circuit and the main display element being located on the substrate at the main display area, an auxiliary pixel circuit and an auxiliary display element connected to the auxiliary pixel circuit, the auxiliary pixel circuit and the auxiliary display element being located on the substrate at the component area, a transmitter located at a side of the auxiliary pixel circuit and the auxiliary display element at the component area, and a bottom metal layer located between the substrate and the auxiliary pixel circuit. The auxiliary pixel circuit includes at least one thin-film transistor. The bottom metal layer is patterned to overlap the at least one thin-film transistor.

The bottom metal layer may overlap only the at least one thin-film transistor.

The auxiliary pixel circuit may include a first thin-film transistor and a second thin-film transistor. The bottom metal layer includes overlapping portions respectively overlapping the first thin-film transistor and the second thin-film transistor, and a connecting portion connecting the overlapping portions.

A signal or a constant voltage may be applied to the bottom metal layer.

The auxiliary display element may include an auxiliary pixel electrode. The display panel further includes a pixel-defining layer having an opening through which a central portion of the auxiliary pixel electrode is exposed, the pixel-defining layer including a light-blocking material.

According to one or more embodiments, a display apparatus includes a display panel including a main display area, a component area, and a peripheral area, and a component located under the display panel at the component area. The display panel includes a substrate, a main pixel circuit and a main display element connected to the main pixel circuit, the main pixel circuit and the main display element being located on the substrate at the main display area, an auxiliary display element located on the substrate at the component area, an auxiliary pixel circuit located on the substrate at the peripheral area, a connection wiring connecting the auxiliary display element to the auxiliary pixel circuit, and a first conductive layer located between the substrate and the auxiliary display element at the component area, the first conductive layer including a plurality of first holes.

The auxiliary display element may include an auxiliary pixel electrode. The first conductive layer is located between the substrate and the auxiliary pixel electrode.

The auxiliary display element may include an auxiliary pixel electrode. An orthogonal projection image of the first conductive layer onto the substrate may completely overlap the auxiliary pixel electrode.

The first conductive layer may be electrically connected to the connection wiring.

Other features and advantages of the disclosure will become more apparent from the drawings, the claims, and the detailed description.

BRIEF DESCRIPTION OF THE DRAWINGS

The above and other aspects and features of certain embodiments will be more apparent from the following description taken in conjunction with the accompanying drawings, in which.

DETAILED DESCRIPTION

Figure 1A:
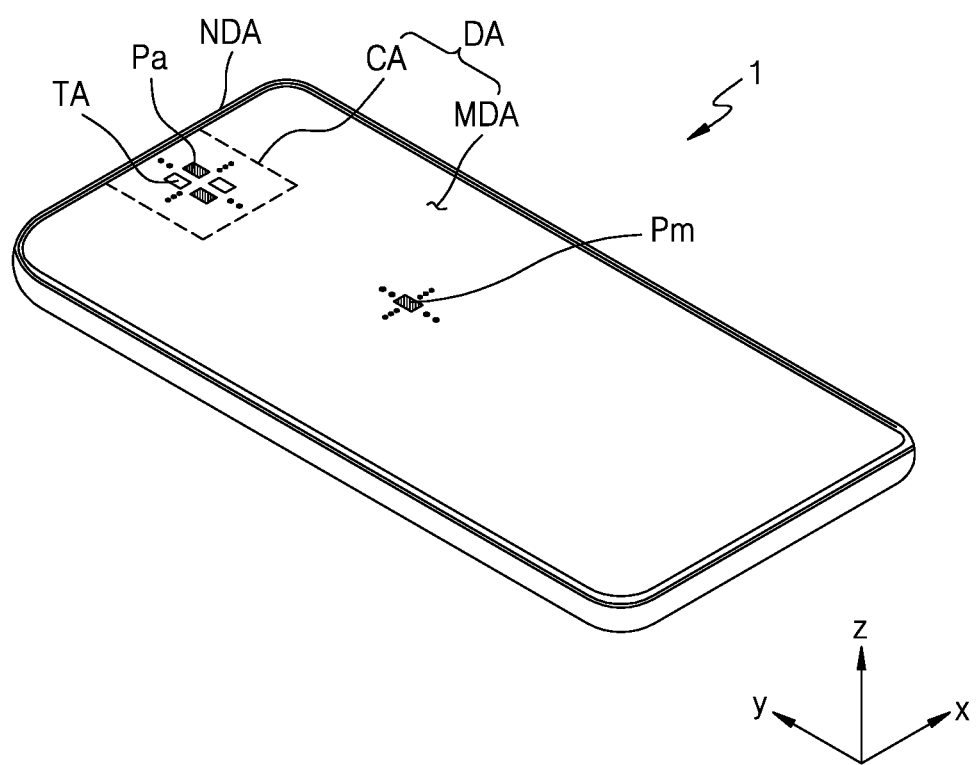
FIGS. 1A-1C are perspective views illustrating a display apparatus according to an embodiment.

References will now be made in detail to embodiments, examples of which are illustrated in the accompanying drawings. Like reference numerals refer to like elements throughout. In this regard, the embodiments of the present disclosure may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a description (e.g., a redundant description) thereof may not be repeated.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

"A and/or B" is used herein to select only A, select only B, or select both A and B. "At least one of A and B" is used to select only A, select only B, or select both A and B.

Further, the use of "may" when describing embodiments of the present disclosure refers to "one or more embodiments of the present disclosure".

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

When a certain embodiment may be implemented differently, a specific process order may be different from the described order. For example, two consecutively described processes may be performed substantially at the same time or may be performed in an order opposite to the described order.

Sizes of elements in the drawings may be exaggerated or contracted for convenience of description. For example, because sizes and thicknesses of elements in the drawings are arbitrarily illustrated for convenience of description, the disclosure is not limited thereto.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
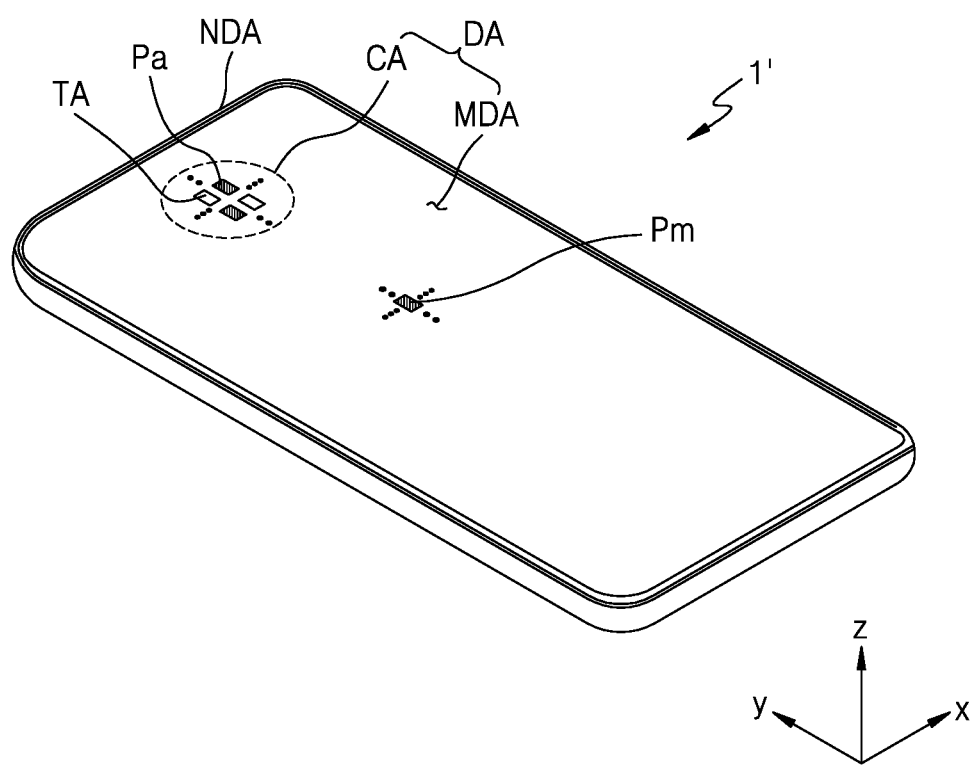
Figure 1C:
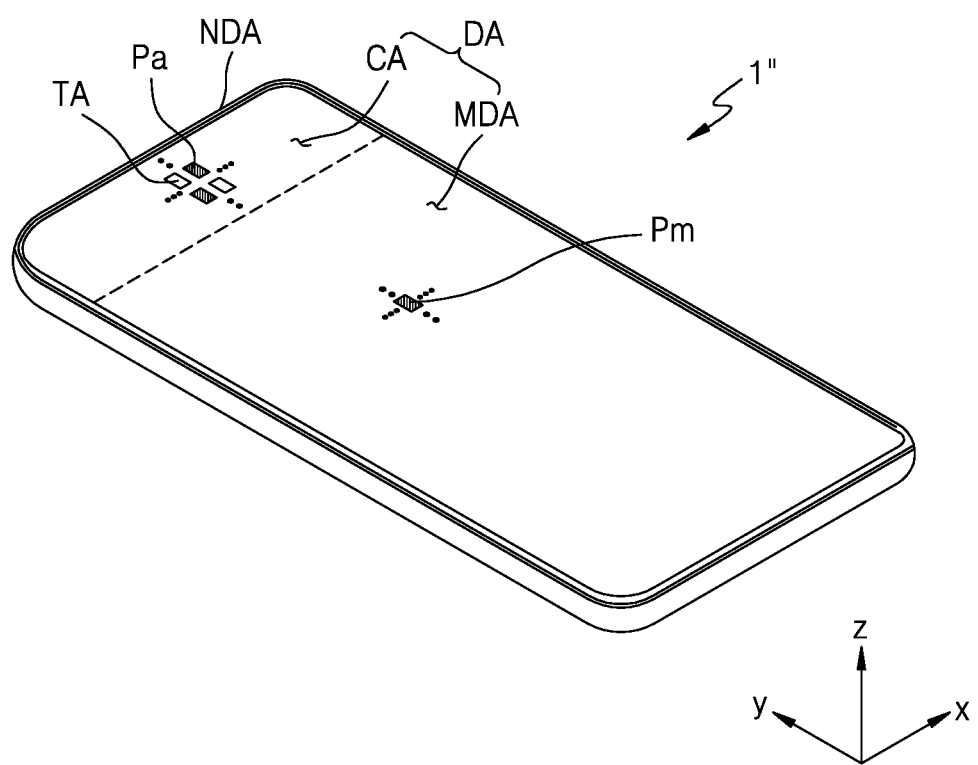

FIGS. 1A-1C are perspective views illustrating a display apparatus according to an embodiment.

Referring to FIG. 1A, a display apparatus 1 includes a display area DA and a peripheral area NDA outside the display area DA. The peripheral area NDA may be around the display area DA. The display area DA includes a component area CA and a main display area MDA at least partially surrounding the component area CA. The component area CA may display an auxiliary image, and the main display area MDA may display a main image. The component area CA and the main display area MDA may display images individually or together. The peripheral area NDA may be a non-display area where display elements are not located. The display area DA may be surrounded (e.g., entirely surrounded) by the peripheral area NDA.

In FIG. 1A, the main display area MDA is located to surround at least a part of one component area CA. In one or more other embodiments, the display apparatus 1 may include two or more component areas CA, and shapes and sizes of the plurality of component areas CA may be different from one another. When viewed in a direction substantially perpendicular to a top surface of the display apparatus 1 (e.g., a plan view), the component area CA may have any of various suitable shapes such as a circular shape, an elliptical shape, a polygonal shape such as a quadrangular shape, a star shape, or a diamond shape. Although the component area CA is located at the center on an upper portion of the main display area MDA having a substantially quadrangular shape (+y direction) when viewed in the direction substantially perpendicular to the top surface of the display apparatus 1 in FIG. 1A, the component area CA may be located on or at a side portion of the main display area MDA having the quadrangular shape, for example, on an upper right portion or an upper left portion of the main display area MDA. For example, the component area CA having a circular shape may be located in the main display area MDA as shown in FIG. 1B, or the component area CA having a rectangular bar shape may be located on a side portion of the main display area MDA as shown in FIG. 1C.

The display apparatus 1 may provide an image by using a plurality of main sub-pixels Pm located in the main display area MDA and a plurality of auxiliary sub-pixels Pa located in the component area CA.

In the component area CA, a component 40 that is an electronic element may be located under a display panel to correspond to the component area CA, as described below with reference to FIG. 2.

A component 40 may be an electronic element using light and/or sound. For example, the electronic element may be a sensor that measures a distance such as a proximity sensor, a sensor that recognizes a user's body part (e.g., a fingerprint, an iris, or a face), a small lamp that outputs light, or an image sensor (e.g., a camera) that captures an image. The electronic element using light may use light of any of various suitable wavelength bands such as visible light, infrared light, or ultraviolet light. The electronic element using sound may use ultrasound or sound of another frequency band. In an embodiments, the component 40 may include sub-components such as a light emitter and a light receiver. The light emitter and the light receiver may be integrated or may be physically separated, to constitute one component 40. In order to reduce or minimize limitation to a function of the component 40, the component area CA may include a transmissive area TA through which light and/or sound output from the component 40 to the outside or traveling from the outside toward the component 40 may be transmitted.

In the case of the display panel and the display apparatus 1 including the same according to an embodiment, when light is transmitted through the component area CA, a light transmittance of the component area CA may be equal to or greater than about 10%, and more preferably, equal to or greater than about 40%, about 25%, about 50%, about 85%, or about 90%.

The plurality of auxiliary sub-pixels Pa may be located in the component area CA. The plurality of auxiliary sub-pixels Pa may emit light to provide a certain image. An image displayed in the component area CA, which is an auxiliary image, may have a resolution lower than a resolution of an image displayed in the main display area MDA. That is, the component area CA may include the transmissive area TA through which light and sound may be transmitted and because a pixel (e.g., an auxiliary sub-pixel Pa) may not be located in the transmissive area TA, the number of auxiliary sub-pixels Pa that may be located per unit area in the component area CA may be less than the number of main sub-pixels Pm located per unit area in the main display area MDA.

Hereinafter, although an organic light-emitting display apparatus is described as the display apparatus 1 according to an embodiment, the display apparatus 1 of the disclosure is not limited thereto. In one or more other embodiments, the display apparatus 1 may be an inorganic light-emitting display apparatus, an inorganic electroluminescent (EL) display apparatus, or a quantum dot light-emitting display apparatus. For example, an emission layer of a display element included in the display apparatus 1 may include an organic material, an inorganic material, quantum dots, an organic material and quantum dots, or an inorganic material and quantum dots.

Figure 2A:
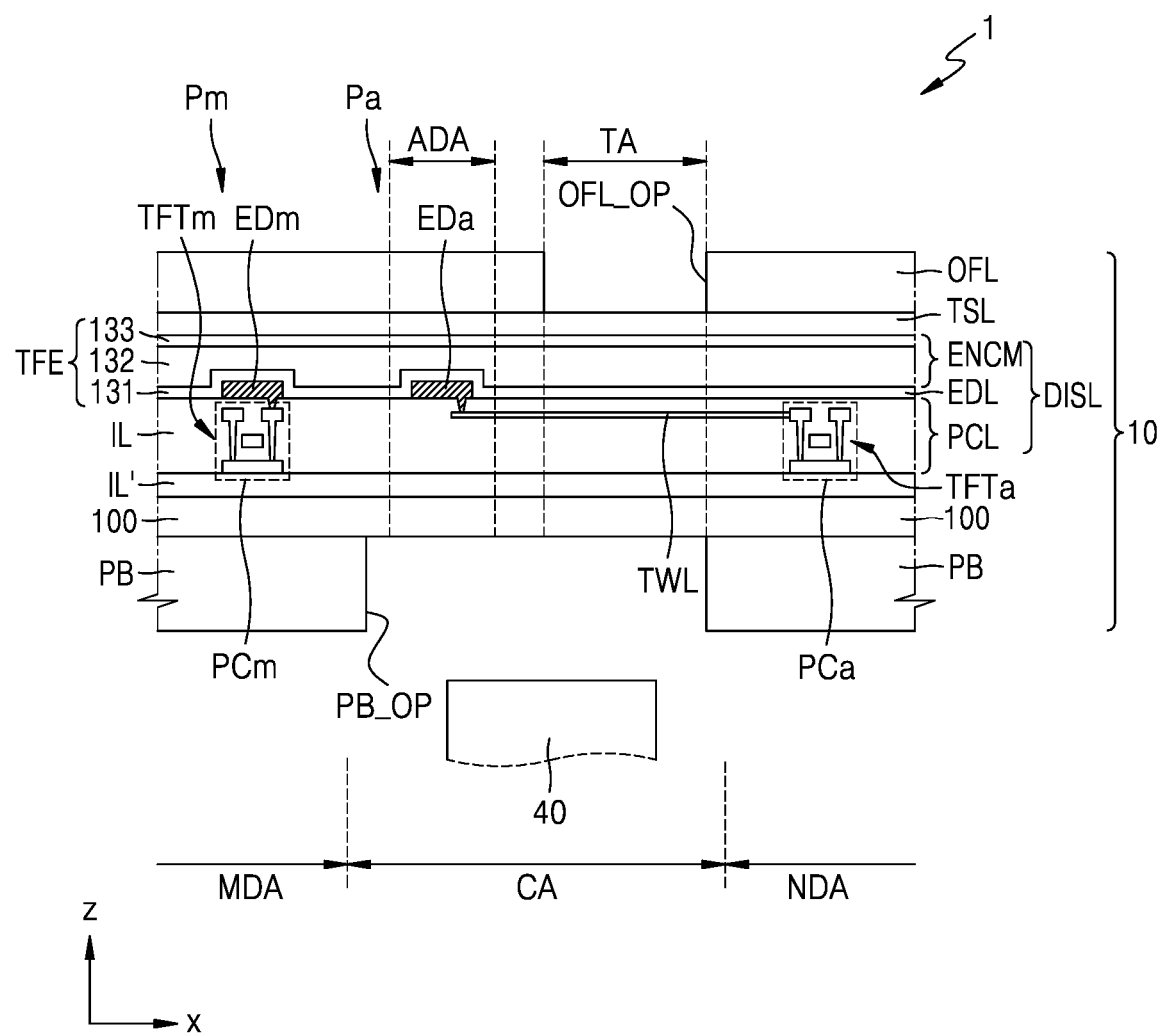
FIGS. 2A and 2B are cross-sectional views illustrating a part of a display apparatus according to one or more embodiments.
Figure 2B:
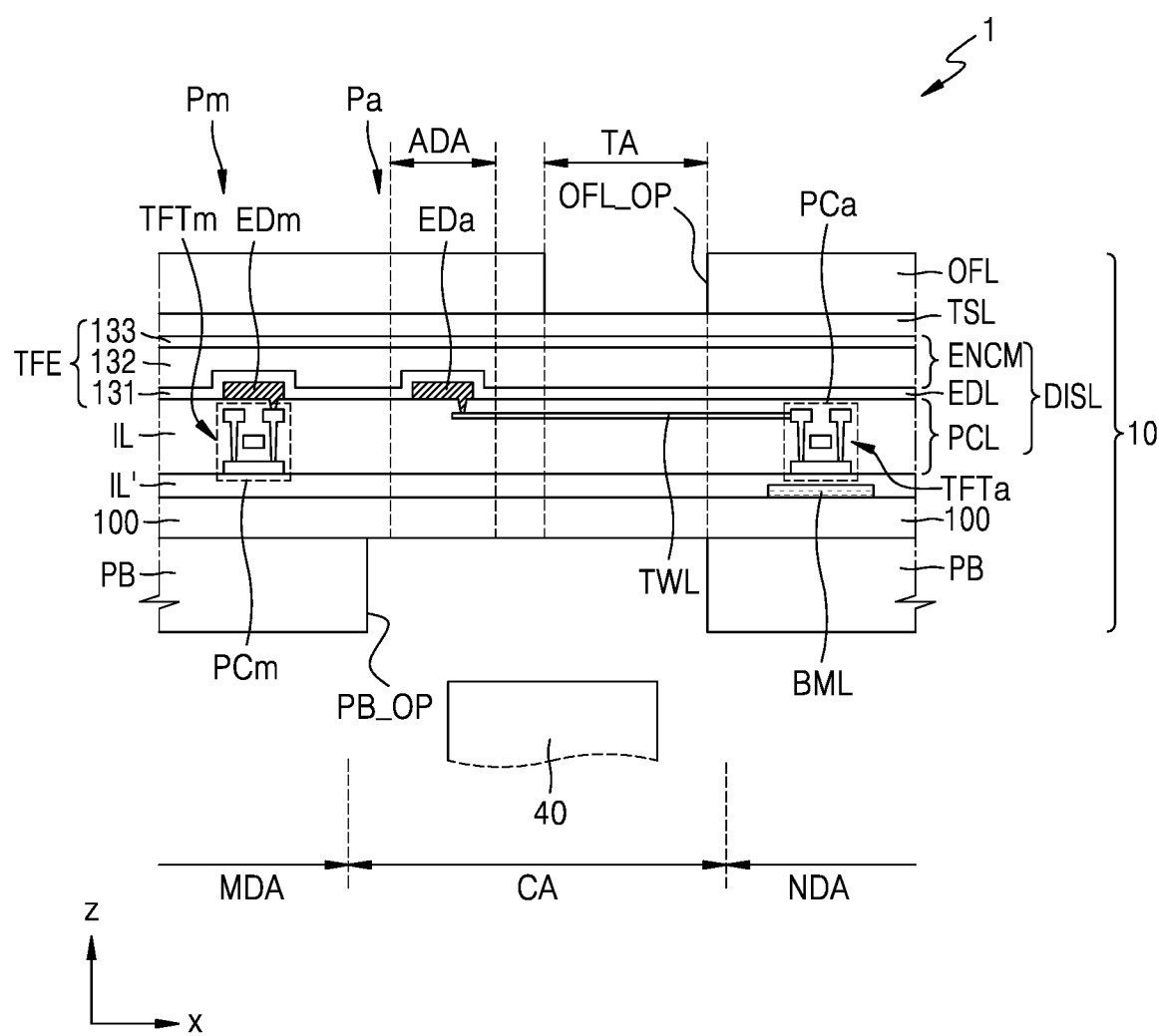

FIGS. 2A and 2B are cross-sectional views illustrating a part of a display apparatus according to one or more embodiments.

Referring to FIG. 2A, the display apparatus 1 may include a display panel 10 and the component 40 overlapping the display panel 10. A cover window that protects the display panel 10 may be further located on the display panel 10.

The display panel 10 includes the component area CA that is an area overlapping (e.g., overlapping in a z direction or a thickness direction of the display panel 10) the component 40 and the main display area MDA where a main image is displayed. The display panel 10 may include a substrate 100, a display layer DISL, a touchscreen layer TSL, and an optical functional layer OFL, which are located over the substrate 100, and a panel protection member PB, which is located under the substrate 100.

The display layer DISL may include a circuit layer PCL including main and auxiliary thin-film transistors TFTm and TFTa, a display element layer EDL including main and auxiliary light-emitting devices EDm and EDa that are display elements, and a sealing member ENCM such as a thin-film encapsulation layer TFE or a sealing substrate. Insulating layers IL and IL' may be located between the substrate 100 and the display layer DISL and in the display layer DISL. In one or more embodiments, for example, the insulating layer IL may be between the substrate 100 and the display layer DISL, and the insulating layer IL' may be in the display layer DISL.

The substrate 100 may be formed of an insulating material such as glass, quartz, and/or a polymer resin. The substrate 100 may be a rigid substrate, or a flexible substrate that is bendable, foldable, and/or rollable.

The main light-emitting device EDm and a main pixel circuit PCm connected to the main light-emitting device EDm may be located in the main display area MDA of the display panel 10. The main pixel circuit PCm may include at least one main thin-film transistor TFTm, and may control an operation of the main light-emitting device EDm. The main sub-pixel Pm may be implemented by light emission of the main light-emitting device EDm.

The auxiliary light-emitting device EDa may be located in the component area CA of the display panel 10 to implement the auxiliary sub-pixel Pa. In the illustrated embodiment, an auxiliary pixel circuit PCa for driving the auxiliary light-emitting device EDa may not be located in the component area CA, but may be located in the peripheral area NDA that is a non-display area. Various suitable modifications may be made. In one or more other embodiments, the auxiliary pixel circuit PCa may be located in a portion of the main display area MDA, or may be located between the main display area MDA and the component area CA. That is, the auxiliary pixel circuit PCa may not overlap the auxiliary light-emitting device EDa.

The auxiliary pixel circuit PCa may include at least one auxiliary thin-film transistor TFTa, and may be connected (e.g., electrically connected) to the auxiliary light-emitting device EDa by a connection wiring TWL. The connection wiring TWL may be formed of a transparent conductive material. The auxiliary pixel circuit PCa may control an operation of the auxiliary light-emitting device EDa. The auxiliary sub-pixel Pa may be implemented by light emission of the auxiliary light-emitting device EDa.

A portion of the component area CA where the auxiliary light-emitting device EDa is located may be defined as an auxiliary display area ADA, and a portion of the component area CA where the auxiliary light-emitting device EDa is not located may be defined as the transmissive area TA.

The transmissive area TA may be an area through which light and/or a signal emitted from the component 40 (e.g., a component 40 located to correspond to the component area CA) or light and/or a signal incident on the component 40 is transmitted. The auxiliary display area ADA and the transmissive area TA may be alternately located or arranged (e.g., alternately arranged in an x direction and/or alternately arranged in a y direction) in the component area CA. The connection wiring TWL that connects the auxiliary pixel circuit PCa to the auxiliary light-emitting device EDa may be located in the transmissive area TA. For example, the auxiliary pixel circuit PCa and the auxiliary light-emitting device EDa may be connected to each other by the connection wiring TWL that extends in a direction (e.g., an x direction). Because the connection wiring TWL may be formed of a transparent conductive material having a high transmittance, although the connection wiring TWL is located in the transmissive area TA, a transmittance of the transmissive area TA may be ensured. In the illustrated embodiment, because the auxiliary pixel circuit PCa is not located in the component area CA, the area of the transmissive area TA may be easily increased and a light transmittance may be further increased.

The display element layer EDL may be covered by the thin-film encapsulation layer TFE or a sealing substrate, as shown in FIG. 2A. In an embodiment, the thin-film encapsulation layer TFE may include at least one inorganic encapsulation layer and at least one organic encapsulation layer, as shown in FIG. 2A. For example, the thin-film encapsulation layer TFE may include first and second inorganic encapsulation layers 131 and 133 and an organic encapsulation layer 132 located between the first and second inorganic encapsulation layers 131 and 133.

Each of the first inorganic encapsulation layer 131 and the second inorganic encapsulation layer 133 may include at least one inorganic insulating material such as silicon oxide (SiO$_2$), silicon nitride (SiN$_x$), silicon oxynitride (SiO$_x$N$_y$), aluminum oxide (Al$_2$O$_3$), titanium oxide (TiO$_2$), tantalum oxide (Ta$_2$O$_5$), hafnium oxide (HfO$_2$), or zinc oxide (ZnO$_2$), and may be formed by using chemical vapor deposition (CVD) or the like. The organic encapsulation layer 132 may include a polymer-based material. Examples of the polymer-based material may include a silicon-based resin, an acrylic resin (e.g., polymethyl methacrylate or polyacrylic resin), an epoxy resin, polyimide, and polyethylene.

The first inorganic encapsulation layer 131, the organic encapsulation layer 132, and the second inorganic encapsulation layer 133 may be integrally formed to cover the main display area MDA and the component area CA.

When the display element layer EDL is sealed with a sealing substrate, the sealing substrate may face the substrate 100 with the display element layer EDL therebetween. There may be a gap between the sealing substrate and the display element layer EDL. The sealing substrate may include glass. A sealant such as frit or the like may be located between the substrate 100 and the sealing substrate, and may be located in the peripheral area NDA. The sealant located in the peripheral area NDA may surround the display area DA and may prevent or reduce penetration of moisture through a side surface.

The touchscreen layer TSL may obtain coordinate information according to an external input, for example, a touch event. The touchscreen layer TSL may include a touch electrode and touch wirings connected to the touch electrode. The touchscreen layer TSL may detect an external input by using a self-capacitive method or a mutual capacitive method.

The touchscreen layer TSL may be formed on the thin-film encapsulation layer TFE. Alternatively, the touchscreen layer TSL may be separately formed on a touch substrate, and then may be coupled to the thin-film encapsulation layer TFE through an adhesive layer such as an optically clear adhesive (OCA). In an embodiment, the touchscreen layer TSL may be formed directly on the thin-film encapsulation layer TFE, and in this case, the adhesive layer may not be located between the touchscreen layer TSL and the thin-film encapsulation layer TFE.

The optical functional layer OFL may include an anti-reflection layer. The anti-reflection layer may reduce a reflectance of light (e.g., external light) incident on the display apparatus 1.

In an embodiment, the optical functional layer OFL may be a polarizing film. The optical functional layer OFL may have an opening OFL_OP corresponding to the transmissive area TA. Accordingly, a light transmittance of the transmissive area TA may be increased (e.g., significantly increased). A transparent material such as an optically clear resin (OCR) may be filled in the opening OFL_OP. In one or more other embodiments, the optical functional layer OFL may be provided as a filter plate including a black matrix and color filters.

The panel protection member PB may be attached to the bottom of the substrate 100, and may support and protect the substrate 100. The panel protection member PB may have an opening PB_OP corresponding to the component area CA. Because the panel protection member PB has the opening PB_OP, a light transmittance of the component area CA may be increased. The panel protection member PB may include polyethylene terephthalate or polyimide.

The component area CA may be greater than an area where the component 40 is located. Accordingly, the area of the opening PB_OP of the panel protection member PB may not be the same as the area of the component area CA. Although the component 40 is located at a side of the display panel 10 to be spaced from the display panel 10 in FIG. 2A, at least a part of the component 40 may be inserted into the opening PB_OP formed in the panel protection member PB.

Also, a plurality of components 40 may be located in the component area CA. The plurality of components 40 may have the same or different functions. For example, the plurality of components 40 may include at least two of a camera (e.g., image pickup device), a solar cell, a flash, a proximity sensor, an illuminance sensor, and an iris sensor.

Although a bottom metal layer BML located under the auxiliary light-emitting device EDa of the component area CA is not located in FIG. 2A, the display apparatus 1 according to an embodiment may include the bottom metal layer BML as shown in FIG. 2B. In an embodiment, the bottom metal layer BML may be located between the substrate 100 and the auxiliary pixel circuit PCa in the peripheral area NDA, to overlap (e.g., overlap in the z direction or a thickness direction of the substrate 100) the auxiliary pixel circuit PCa. The bottom metal layer BML may prevent or substantially prevent external light from reaching the auxiliary pixel circuit PCa. In one or more other embodiments, the bottom metal layer BML may be formed to correspond to the entire display area DA, and may have a bottom hole corresponding to the component area CA.

Figure 3:
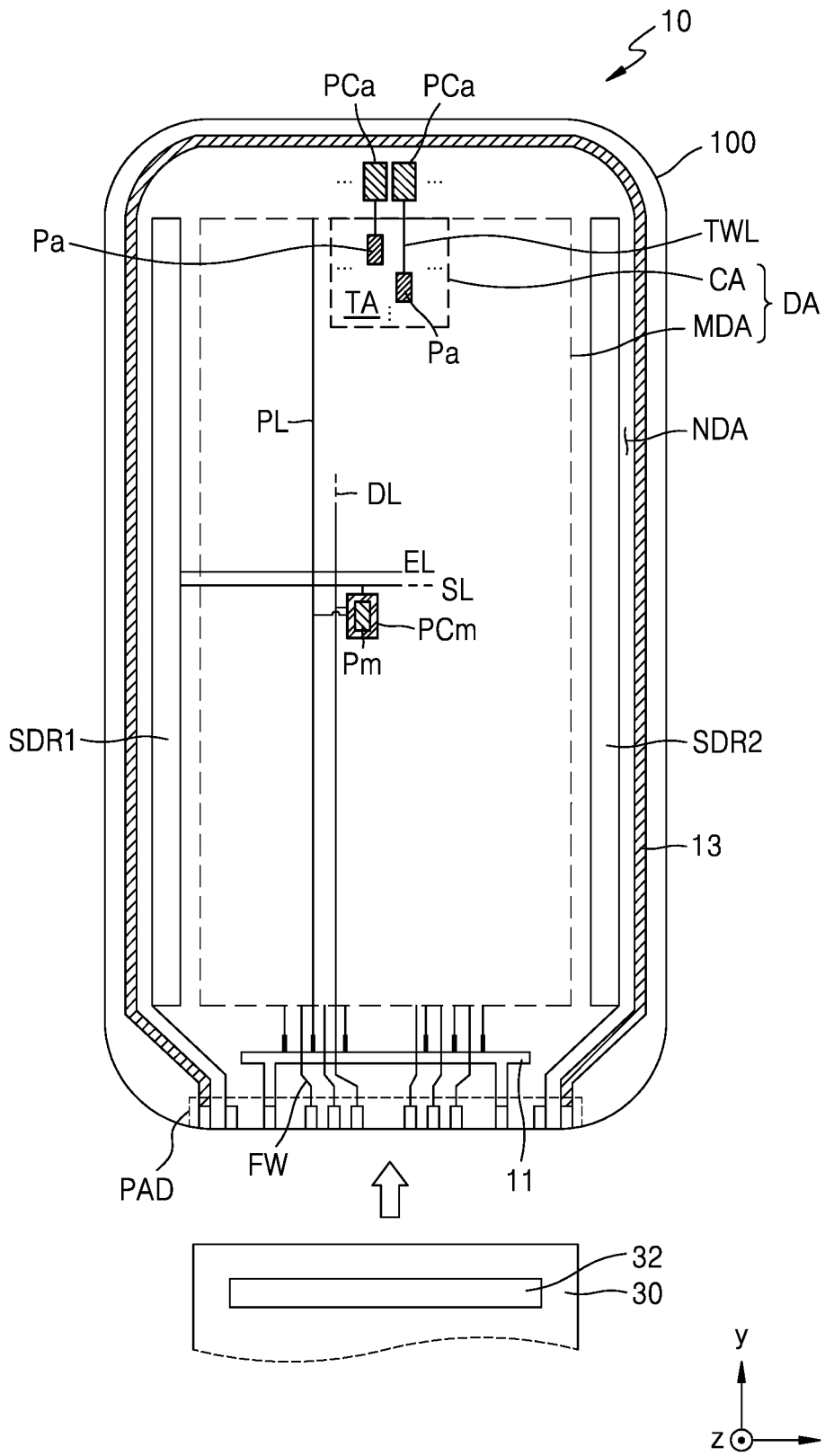
FIG. 3 is a plan view illustrating a display panel that may be included in the display apparatus of FIG. 1.

FIG. 3 is a plan view illustrating a display panel that may be included in the display apparatus of FIG. 1.

Referring to FIG. 3, various elements of the display panel 10 are located on the substrate 100.

The plurality of main sub-pixels Pm are located in the main display area MDA. Each of the main sub-pixels Pm may be implemented as a light-emitting device by a display element such as an organic light-emitting diode (OLED). The main pixel circuit PCm for driving the main sub-pixel Pm may be located in the main display area MDA, to overlap the main sub-pixel Pm. Each main sub-pixel Pm may emit, for example, red light, green light, blue light, or white light. The main display area MDA may be covered by a sealing member and may be protected from external air or moisture.

The component area CA may be located on a side portion of the main display area MDA as described above, or may be located inside the display area DA and may be surrounded by the main display area MDA. The plurality of auxiliary sub-pixels Pa are located in the component area CA. Each of the plurality of auxiliary sub-pixels Pa may be implemented as a light-emitting device by a display element such as an organic light-emitting diode (OLED). Each auxiliary sub-pixel Pa may emit, for example, red light, green light, blue light, or white light. The component area CA may be covered by a sealing member and may be protected from external air or moisture.

The auxiliary pixel circuit PCa for driving the auxiliary sub-pixel Pa may be located in the peripheral area NDA close to the component area CA. For example, when the component area CA is located on an upper portion of the display area DA as shown in FIG. 3, the auxiliary pixel circuit PCa may be located on an upper portion of the peripheral area NDA. The auxiliary pixel circuit PCa and a display element for implementing the auxiliary sub-pixel Pa may be connected to each other by the connection wiring TWL that extends in a direction (e.g., a y direction as shown in FIG. 3).

In an embodiment, although the auxiliary pixel circuit PCa is located above (e.g., directly above) the component area CA in FIG. 3, the disclosure is not limited thereto. In one or more other embodiments, the auxiliary pixel circuit PCa may be located below, on the right of, and/or on the left of the component area CA with suitable changes to the connection wiring TWL connecting the auxiliary pixel circuit PCa and a display element for implementing the auxiliary sub-pixel Pa.

In an embodiment, the component area CA may include the transmissive area TA. The transmissive area TA may surround the plurality of auxiliary sub-pixels Pa. Alternatively, transmissive areas TA and the plurality of auxiliary sub-pixels Pa may be arranged in a lattice pattern.

Because the component area CA includes the transmissive area TA, a resolution of the component area CA may be lower than a resolution of the main display area MDA. For example, a resolution of the component area CA may be about ½, ⅜, ⅓, ¼, ⅖, ⅛, ⅑, or 1/16 of a resolution of the main display area MDA. For example, a resolution of the main display area MDA may be about 400 ppi or more, and a resolution of the component area CA may be about 200 ppi or about 100 ppi.

The main and auxiliary pixel circuits PCm and PCa for respectively driving the main and auxiliary sub-pixels Pm and Pa may be connected (e.g., electrically connected) to outer circuits located in the peripheral area NDA. A first scan driving circuit SDR1, a second scan driving circuit SDR2, a terminal unit PAD, a driving voltage supply line 11, and a common voltage supply line 13 may be located in the peripheral area NDA.

The first scan driving circuit SDR1 may apply a scan signal to the main pixel circuit PCm for driving the main sub-pixel Pm through a scan line SL. Also, the first scan driving circuit SDR1 may apply an emission control signal to each pixel circuit through an emission control line EL. The second scan driving circuit SDR2 may be symmetric to the first scan driving circuit SDR1 about the main display area MDA. Some of the main pixel circuits PCm of the main sub-pixels Pm of the main display area MDA may be connected (e.g., electrically connected) to the first scan driving circuit SDR1, and the others may be connected (e.g., electrically connected) to the second scan driving circuit SDR2.

The pad unit PAD may be located on a side portion of the substrate 100. The pad unit PAD is exposed without being covered by an insulating layer, and is connected to a display circuit board 30. A display driver 32 may be located on the display circuit board 30.

The display driver 32 may generate a control signal transmitted to the first scan driving circuit SDR1 and the second scan driving circuit SDR2. The display driver 32 may generate a data signal, and the generated data signal may be transmitted to the main pixel circuit PCm through a fan-out wiring FW and a main data line DLm connected to the fan-out wiring FW.

The display driver 32 may supply a driving voltage ELVDD to the driving voltage supply line 11, and may supply a common voltage ELVSS to the common voltage supply line 13. The driving voltage ELVDD may be applied to pixel circuits of the main and auxiliary sub-pixels Pm and Pa through a driving voltage line PL connected to the driving voltage supply line 11, and the common voltage ELVSS may be applied to a counter electrode of a display element connected to the common voltage supply line 13.

The driving voltage supply line 11 may be located below the main display area MDA and may extend in an x-direction. The common voltage supply line 13 may have a loop shape with an open side (e.g., an open side at the side portion of the substrate 100 as shown in FIG. 3), and may be around or partially around (e.g., partially surround) the main display area MDA.

Although one component area CA is shown in FIG. 3, a plurality of component areas CA may be provided. In this case, the plurality of component areas CA may be spaced from one another, and a first camera may be located to correspond to one component area CA and a second camera may be located to correspond to another component area CA. Alternatively, a camera may be located to correspond to one component area CA, and an infrared sensor may be located to correspond to another component area CA. Shapes and sizes of the plurality of component areas CA may be different from one another.

Figure 4A:
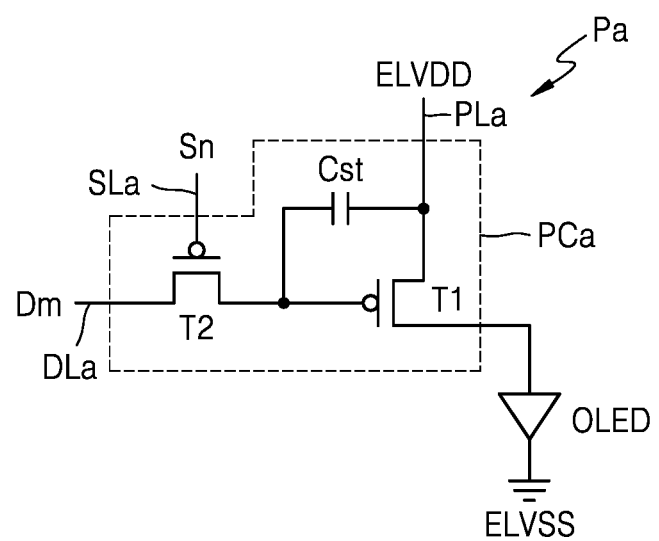
FIGS. 4A and 4B are equivalent circuit diagrams illustrating a pixel that may be included in a display apparatus according to an embodiment.
Figure 4B:
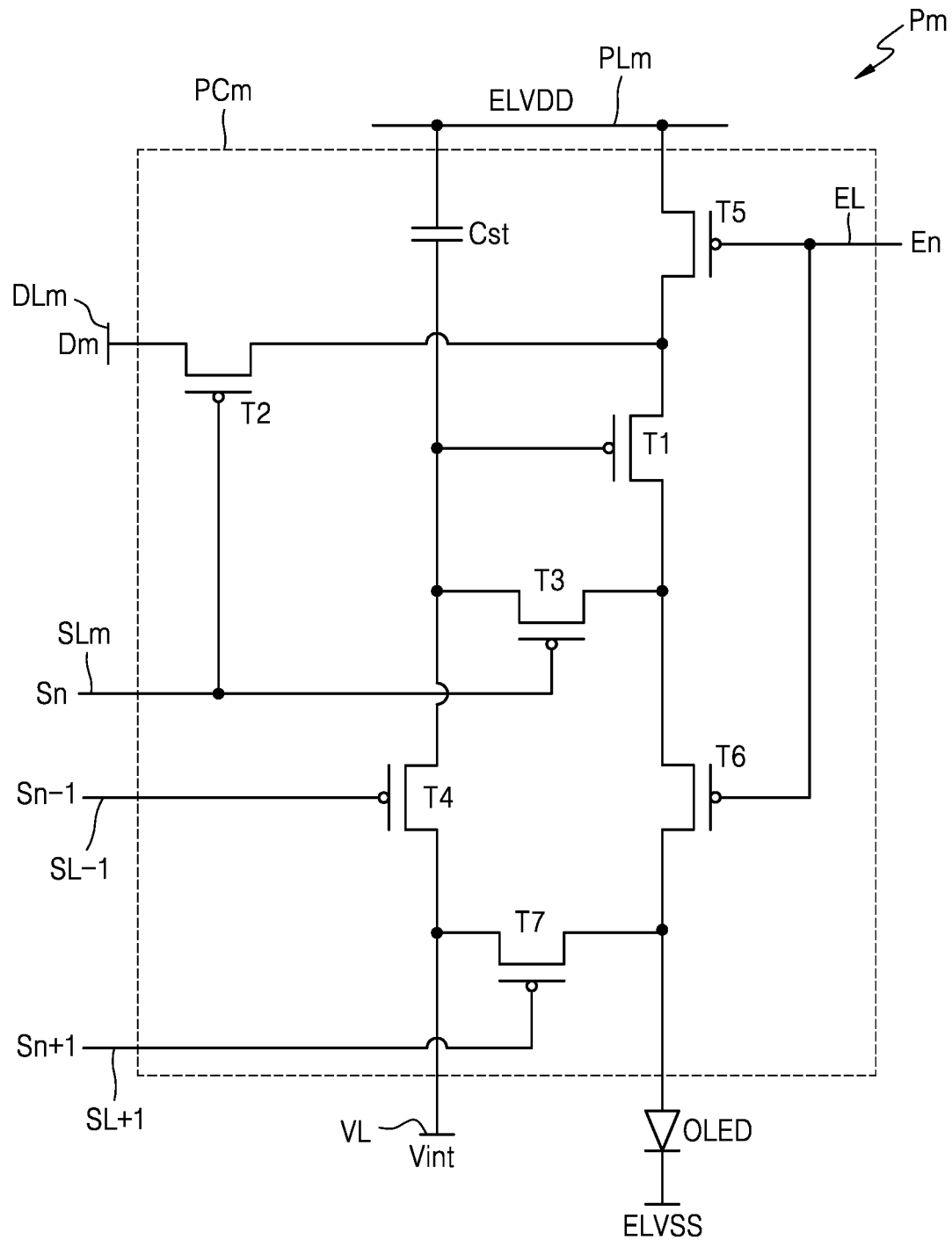

FIGS. 4A and 4B are equivalent circuit diagrams illustrating a pixel that may be included in a display apparatus according to an embodiment.

Referring to FIGS. 4A and 4B, the main sub-pixel Pm includes the main pixel circuit PCm and an organic light-emitting diode OLED that is a display element connected to the main pixel circuit PCm, and the auxiliary sub-pixel Pa includes the auxiliary pixel circuit PCa and an organic light-emitting diode OLED that is a display element connected to the auxiliary pixel circuit PCa. Although the auxiliary sub-pixel Pa includes a pixel circuit of FIG. 4A and the main sub-pixel Pm includes a pixel circuit of FIG. 4B, the disclosure is not limited thereto. In one or more other embodiments, the main and auxiliary sub-pixels Pm and Pa may include at least one of the pixel circuits of FIG. 4A or 4B. For example, both the main sub-pixel Pm and the auxiliary sub-pixel Pa may include the pixel circuit of FIG. 4B.

The auxiliary pixel circuit PCa of FIG. 4A may include a driving thin-film transistor T1, a switching thin-film transistor T2, and a storage capacitor Cst. The switching thin-film transistor T2 is connected to an auxiliary scan line SLa and an auxiliary data line DLa, and transmits a data signal Dm input through the auxiliary data line DLa to the driving thin-film transistor T1 according to a scan signal Sn input through the auxiliary scan line SLa.

The storage capacitor Cst is connected to the switching thin-film transistor T2 and an auxiliary driving voltage line PLa, and stores a voltage corresponding to a difference between a voltage received from the switching thin-film transistor T2 and a driving voltage ELVDD supplied to the auxiliary driving voltage line PLa.

The driving thin-film transistor T1 may be connected to the auxiliary driving voltage line PLa and the storage capacitor Cst, and may control driving current flowing through the organic light-emitting diode OLED from the auxiliary driving voltage line PLa in response to a value of the voltage stored in the storage capacitor Cst. The organic light-emitting diode OLED may emit light having a certain luminance according to driving current $I_d$.

Although the auxiliary pixel circuit PCa includes two thin-film transistors and one storage capacitor in FIG. 4A, the disclosure is not limited thereto. In one or more other embodiments, the auxiliary pixel circuit PCa may include seven thin-film transistors and one storage capacitor. In one or more other embodiments, the auxiliary pixel circuit PCa may include two or more storage capacitors.

Referring to FIG. 4B, the main pixel circuit PCm may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Although each main pixel circuit PCm includes (main) signal lines (e.g., SL, SL−1, SL+1, EL, and DL), a (main)

initialization voltage line VL, and a (main) driving voltage line PL in FIG. 4B, the disclosure is not limited thereto. In one or more other embodiments, at least one of the (main) signal lines (e.g., SL, SL−1, SL+1, EL, or DL), and the (main) initialization voltage line VL may be shared with neighboring pixel circuits.

A drain electrode of the driving thin-film transistor T1 may be connected (e.g., electrically connected) to the organic light-emitting diode OLED via the emission control thin-film transistor T6. The driving thin-film transistor T1 receives a data signal Dm and supplies driving current to the main organic light-emitting diode OLED according to a switching operation of the switching thin-film transistor T2.

A gate electrode of the switching thin-film transistor T2 is connected to a main scan line SLm, and a source electrode of the switching thin-film transistor T2 is connected to a main data line DLm. A drain electrode of the switching thin-film transistor T2 may be connected to a source electrode of the driving thin-film transistor T1, and may be connected to a main driving voltage line PLm via the operation control thin-film transistor T5.

The switching thin-film transistor T2 is turned on according to a scan signal Sn received through the main scan line SLm, and performs a switching operation of transmitting the data signal Dm through the main data line DLm to the source electrode of the driving thin-film transistor T1.

A gate electrode of the compensation thin-film transistor T3 may be connected to the main scan line SLm. A source electrode of the compensation thin-film transistor T3 may be connected to the drain electrode of the driving thin-film transistor T1, and may be connected to a pixel electrode of the organic light-emitting diode OLED via the emission control thin-film transistor T6. A drain electrode of the compensation thin-film transistor T3 may be connected to one electrode of the storage capacitor Cst, a source electrode of the first initialization thin-film transistor T4, and a gate electrode of the driving thin-film transistor T1. The compensation thin-film transistor T3 is turned on according to the scan signal Sn received through the main scan line SLm, and diode-connects the driving thin-film transistor T1 by connecting the gate electrode to the drain electrode of the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. The source electrode of the first initialization thin-film transistor T4 may be connected to the one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn−1 received through the previous scan line SL−1, and may perform an initialization operation of initializing a voltage of the gate electrode of the driving thin-film transistor T1 by supplying an initialization voltage Vint to the gate electrode of the driving thin-film transistor T1.

A gate electrode of the operation control thin-film transistor T5 may be connected to an emission control line EL. A source electrode of the operation control thin-film transistor T5 may be connected to the main driving voltage line PLm. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be connected (e.g., electrically connected) to the pixel electrode of the organic light-emitting diode OLED. The operation control thin-film transistor T5 and the emission control thin-film transistor T6 may be concurrently (e.g., simultaneously) turned on according to an emission control signal En received through the emission control line EL, and thus a driving voltage ELVDD is supplied to the organic light-emitting diode OLED and driving current flows through the organic light-emitting diode OLED.

A gate electrode of the second initialization thin-film transistor T7 may be connected to a next scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on according to a next scan signal Sn+1 received through the next scan line SL+1, and may initialize the pixel electrode of the organic light-emitting diode OLED.

Although the first initialization thin-film transistor T4 and the second initialization thin-film transistor T7 are respectively connected to the previous scan line SL−1 and the next scan line SL+1 in FIG. 4B, the disclosure is not limited thereto. In one or more other embodiments, both the first initialization thin-film transistor T4 and the second initialization thin-film transistor T7 may be connected to the previous scan line SL−1 and may be driven according to the previous scan signal Sn−1.

The other electrode of the storage capacitor Cst may be connected to the main driving voltage line PLm. Any one electrode of the storage capacitor Cst may be connected to the gate electrode of the driving thin-film transistor T1, the drain electrode of the compensation thin-film transistor T3, and/or the source electrode of the first initialization thin-film transistor T4.

A counter electrode (e.g., cathode) of the organic light-emitting diode OLED receives a common voltage ELVSS. The organic light-emitting diode OLED may receive driving current from the driving thin-film transistor T1 and may emit light.

In the main and auxiliary pixel circuits PCm and PCa according to an embodiment, the number of thin-film transistors and storage capacitors and a circuit design are not limited to those described with reference to FIGS. 4A and 4B, and the number and circuit design thereof may be changed in various suitable ways.

Figure 5A:
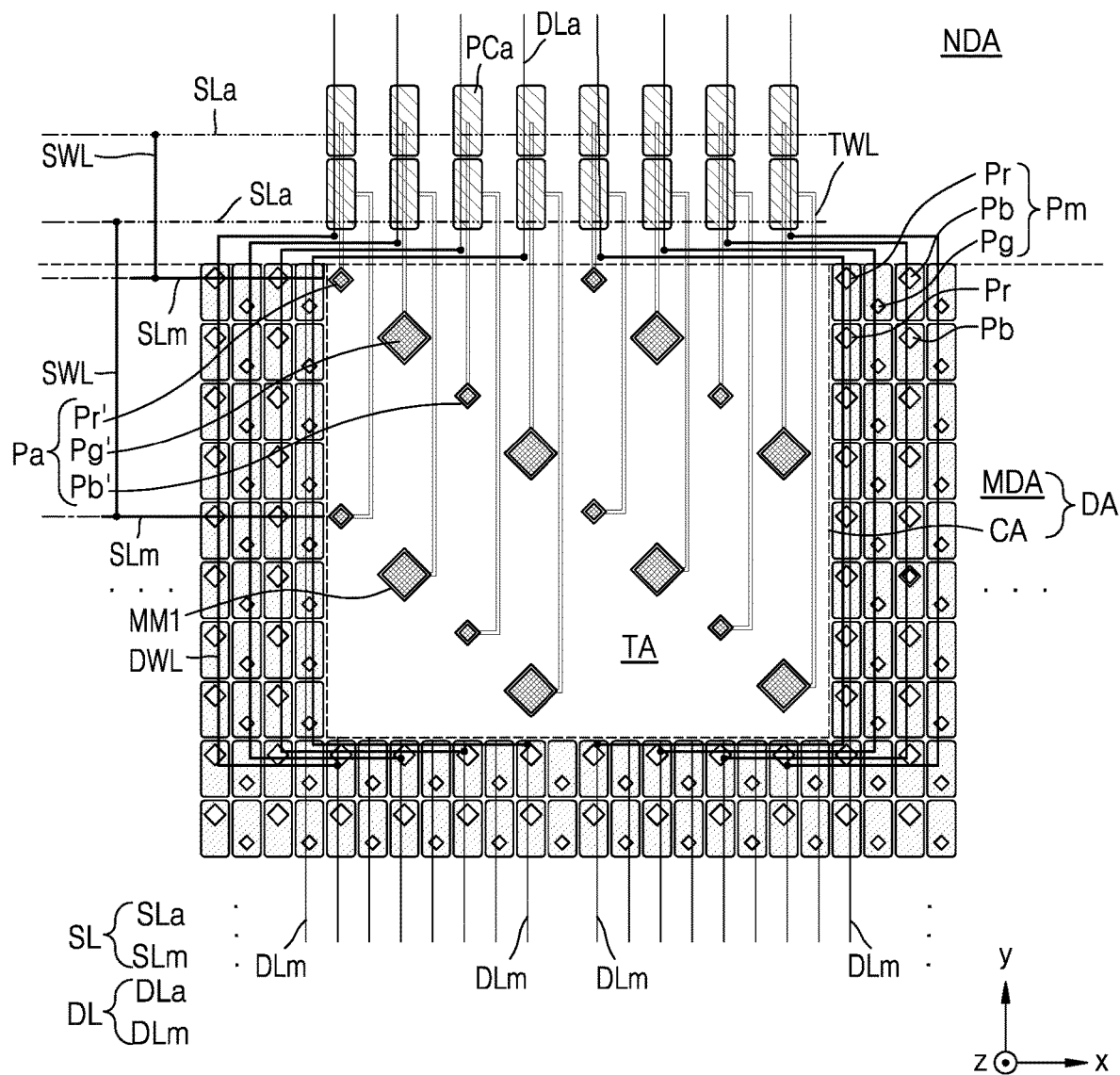
FIGS. 5A and 5B are plan views illustrating an arrangement of a portion of a display apparatus according to one or more embodiments.
Figure 5B:
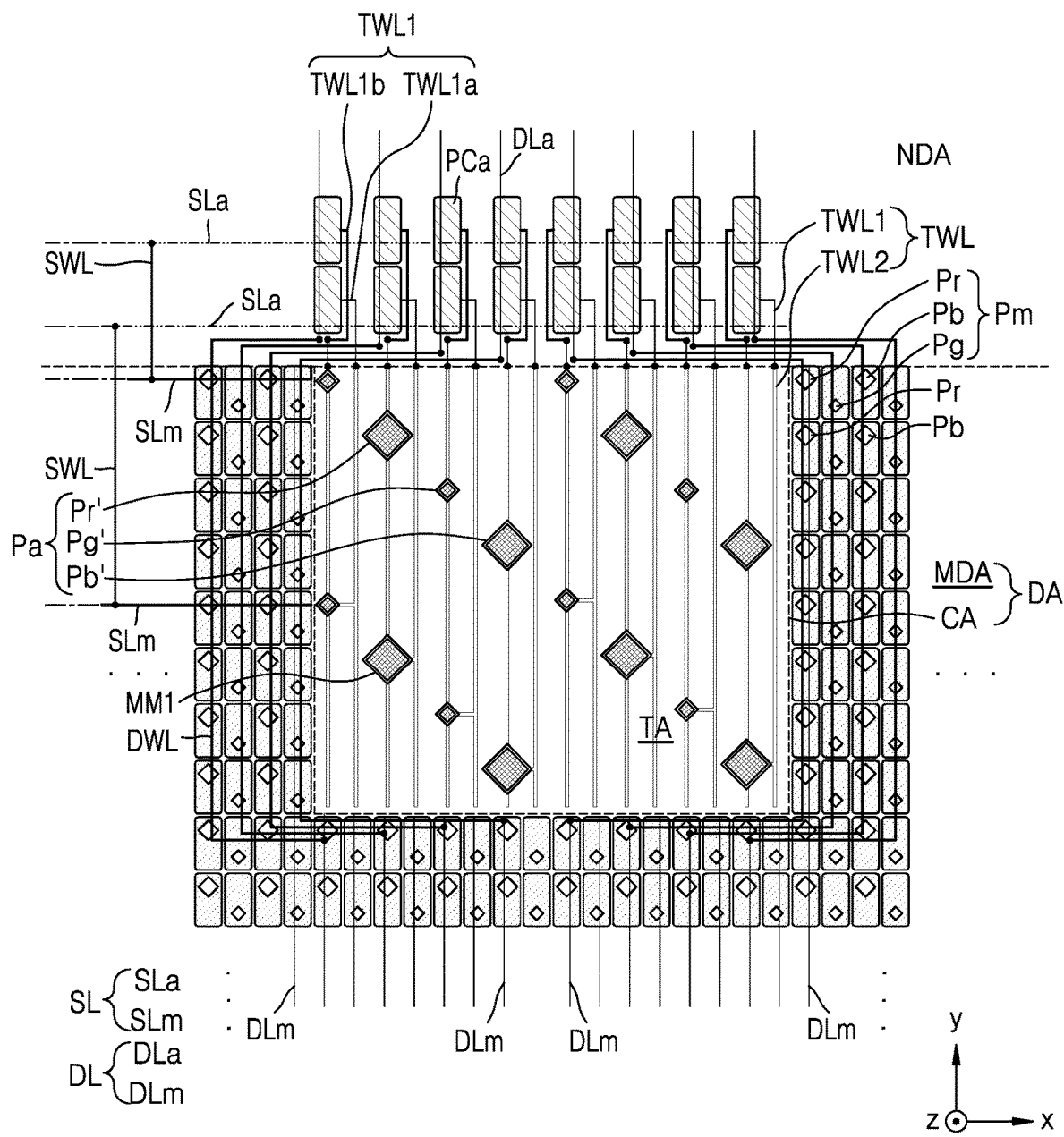

FIGS. 5A and 5B are plan views illustrating an arrangement of a portion of a display apparatus according to one or more embodiments. In detail, FIGS. 5A and 5B illustrate parts of the component area CA, and the main display are MDA and the peripheral area NDA adjacent to the component area CA.

Referring to FIG. 5A, the plurality of main sub-pixels Pm may be located in the main display area MDA. The term 'sub-pixel' used herein, which is a minimum unit for forming an image, refers to an emission area where light is emitted by a display element. When an organic light-emitting diode is used as a display element, the emission area may be defined by an opening of a pixel-defining layer, which will be described below. Each of the plurality of main sub-pixels Pm may emit any one of red light, green light, blue light, and white light.

In an embodiment, the main sub-pixel Pm located in the main display area MDA may include a first sub-pixel Pr, a second sub-pixel Pg, and a third sub-pixel Pb. The first sub-pixel Pr, the second sub-pixel Pg, and the third sub-pixel Pb may respectively represent a red color, a green color, and a blue color. The main sub-pixels Pm may be arranged in a PENTILE® structure (PENTILE® is a registered trademark of Samsung Display Co., Ltd., Republic of Korea) or an RGBG matrix structure.

For example, the first sub-pixels Pr may be located at first and third vertices facing each other from among vertices of a virtual quadrangle with a central point of the second sub-pixel Pg as a central point of the virtual quadrangle, and the third sub-pixels Pb may be located at second and fourth vertices that are the remaining vertices. In an embodiment a size of the second sub-pixel Pg (i.e., an emission size) may be less than a size (e.g., an emission size) of each of the first sub-pixel Pr and the third sub-pixel Pb.

Such a pixel arrangement structure may be referred to as an RGBG matrix structure, a PENTILE® matrix structure or a PENTILE® structure, and a rendering driving method that represents a color by sharing adjacent pixels may be used, thereby displaying an image having a high resolution with a relatively small number of pixels.

Although the plurality of main sub-pixels Pm are arranged in a PENTILE® matrix structure in FIG. 5A, the disclosure is not limited thereto. For example, the plurality of main sub-pixels Pm may be arranged in any of various suitable structures such as a stripe structure, a mosaic arrangement structure, or a delta arrangement structure.

In the main display area MDA, the main pixel circuits PCm may overlap the main sub-pixels Pm, and the main pixel circuits PCm may be arranged in a matrix form in the x direction and the y direction. The main pixel circuit PCm used herein refers to a unit of a pixel circuit for implementing one main sub-pixel Pm.

The plurality of auxiliary sub-pixels Pa may be located in the component area CA. Each of the plurality of main sub-pixels Pm may emit any one of red light, green light, blue light, and white light. The auxiliary sub-pixels Pa may include a first sub-pixel Pr', a second sub-pixel Pg', and a third sub-pixel Pb' that emit light of different colors from each other. The first sub-pixel Pr', the second sub-pixel Pg', and the third sub-pixel Pb' may respectively represent a red color, a green color, and a blue color.

The number of auxiliary sub-pixels Pa located per unit area in the component area CA may be less than the number of main sub-pixels Pm located per unit area in the main display area MDA. A ratio between the number of auxiliary sub-pixels Pa and the number of main sub-pixels Pm located per unit area may be 1:2, 1:4, 1:8, or 1:9. That is, a ratio between a resolution of the component area CA and a resolution of the main display area MDA may be ½, ¼, ⅛, or ⅑. In FIG. 5A, a resolution of the component area CA is ⅛.

The auxiliary sub-pixels Pa located in the component area CA may be arranged in any of various suitable structures. Some of the auxiliary sub-pixels Pa may be gathered to form a pixel group, and may be arranged in any of various suitable structures such as a PENTILE® structure, a stripe structure, a mosaic arrangement structure, or a delta arrangement structure within the pixel group. In this case, a distance between the auxiliary sub-pixels Pa located in the pixel group may be the same as a distance between the main sub-pixels Pm.

Alternatively, as shown in FIG. 5A, the auxiliary sub-pixels Pa may be distributed in the component area CA. That is, a distance between the auxiliary sub-pixels Pa (e.g., between adjacent ones of the auxiliary sub-pixels Pa) may be greater than a distance between the main sub-pixels Pm (e.g., between adjacent ones of the main sub-pixels Pm). A portion of the component area CA where the auxiliary sub-pixels Pa are not located may be the transmissive area TA having a high light transmittance.

The auxiliary pixel circuits PCa for implementing light emission of the auxiliary sub-pixels Pa may be located in the peripheral area NDA. Because the auxiliary pixel circuits PCa are not located in the component area CA, the component area CA may secure a wider transmissive area TA.

The auxiliary pixel circuits PCa may respectively be connected to the auxiliary sub-pixels Pa through the connection wirings TWL. Accordingly, when a length of the connection wiring TWL increases, RC delay may occur. Accordingly, the auxiliary pixel circuits PCa may be arranged considering the lengths of the connection wirings TWL.

In an embodiment, the auxiliary pixel circuits PCa may be located on an extension line that connects the auxiliary sub-pixels Pa arranged in the y direction. Also, the number of auxiliary pixel circuits PCa arranged in the y direction may be the same as the number of auxiliary sub-pixels Pa arranged in the y direction. For example, when two auxiliary sub-pixels Pa are arranged in the y direction in the component area CA as shown in FIG. 5A, two auxiliary pixel circuits PCa may be arranged in the y direction in the peripheral area NDA.

The connection wirings TWL may extend in the y direction, to respectively connect the auxiliary sub-pixels Pa to the auxiliary pixel circuits PCa. When the connection wiring TWL is connected to the auxiliary sub-pixel Pa, it may refer to the connection wiring TWL being connected (e.g., electrically connected) to a pixel electrode of a display element for implementing the auxiliary sub-pixel Pa.

The scan line SL may include the main scan line SLm connected to the main pixel circuits PCm, and the auxiliary scan line SLa connected to the auxiliary pixel circuits PCa. The main scan line SLm may extend in the x direction, and may be connected to the main pixel circuits PCm located in the same row. The main scan line SLm may not be located in the component area CA. That is, the main scan line SLm may be disconnected with the component area CA therebetween. In this case, the main scan line SLm located on the left of the component area CA may receive a signal from the first scan driving circuit SDR1 (e.g., see FIG. 3), and the main scan line SLm located on the right of the component area CA may receive a signal from the second scan driving circuit SDR2 (e.g., see FIG. 3).

The main scan line SLa may extend in the x-direction, and may be connected to the auxiliary pixel circuits PCa located in the same row. The auxiliary scan line SLa may be located in the peripheral area NDA.

The main scan line SLm and the auxiliary scan line SLa may be connected to each other by a scan connection line SWL, and the same signal may be applied to pixel circuits for driving the main sub-pixel Pm and the auxiliary sub-pixel Pa located in the same row. The scan connection line SWL may be located on or at a different layer from the main scan line SLm and the auxiliary scan line SLa, and the scan connection line SWL may be connected to the main scan line SLm and the auxiliary scan line SLa through respective contact holes. The scan connection line SWL may be located in the peripheral area NDA.

The data line DL may include the main data line DLm connected to the main pixel circuits PCm and the auxiliary data line DLa connected to the auxiliary pixel circuits PCa. The main data line DLm may extend in the y direction, and may be connected to the main pixel circuits PCm located in the same column. The auxiliary data line DLa may extend in the y direction, and may be connected to the auxiliary pixel circuits PCa located in the same column.

The main data line DLm and the auxiliary data line DLa may be spaced from each other with the component area CA therebetween. The main data line DLm and the auxiliary data line DLa may be connected to each other by a data connection line DWL, to apply the same signal to pixel circuits for driving the main sub-pixel Pm and the auxiliary sub-pixel Pa located in the same column.

The data connection line DWL may be located to bypass the component area CA. For example, the data connection line DWL may not overlap the component area CA. In an embodiment, the data connection line DWL may overlap the main pixel circuits PCm located in the main display area MDA. As the data connection line DWL is located in the main display area MDA, a separate space in which the data connection line DWL is located does not need to be secured, thereby minimizing a size of a dead space.

In one or more other embodiments, the data connection line DWL may be located in an intermediate area between the main display area MDA and the component area CA.

The data connection line DWL may be located on or at a different layer from the main data line DLm and the auxiliary data line DLa, and the data connection line DWL may be connected to the main data line DLm to the auxiliary data line DLa through respective contact holes.

Although the connection wiring TWL is integrally formed from the peripheral area NDA to the auxiliary sub-pixels Pa of the component area CA in FIG. 5A, the disclosure is not limited thereto.

The connection wiring TWL may include a first connection wiring TWL1 and a second connection wiring TWL2 formed of different materials from each other, as shown in FIG. 5B.

The first connection wiring TWL1 may be located in the peripheral area NDA and may be connected to the auxiliary pixel circuit PCa. The first connection wiring TWL1 may include a conductive material including molybdenum (Mo), aluminum (Al), copper (Cu), or titanium (Ti), and may have a single layer structure or a multi-layer structure including the above material. A plurality of first connection wirings TWL1 may be provided between the auxiliary pixel circuits PCa. In an embodiment, the first connection wiring TWL1 may include a $1\text{-}1^{th}$ connection wiring TWL1a and a $1\text{-}2^{th}$ connection wiring TWL1b located on or at different layers. For example, the $1\text{-}1^{th}$ connection wiring TWL1a and the data line DL may be located on or at the same layer, and may include the same material. The $1\text{-}2^{th}$ connection wiring TWL1b and the $1\text{-}1^{th}$ connection wiring TWL1a may be located with an insulating layer therebetween. The $1\text{-}1^{th}$ connection wiring TWL1a and the $1\text{-}2^{th}$ connection wiring TWL1b may be located between the auxiliary pixel circuits PCa, and at least a part of each of the $1\text{-}1^{th}$ connection wiring TWL1a and the $1\text{-}2^{th}$ connection wiring TWL1b may be bent in a plan view. A plurality of $1\text{-}1^{th}$ connection wirings TWL1a and a plurality of $1\text{-}2^{th}$ connection wirings TWL1b may be located on or at different layers, and the $1\text{-}1^{th}$ connection wirings TWL1a and the $1\text{-}2^{th}$ connection wirings TWL1b may be alternately arranged between the plurality of auxiliary pixel circuits PCa.

The second connection wiring TWL2 may be located in the component area CA, and may be connected to the first connection wiring TWL1 at an edge of the component area CA. The second connection wiring TWL2 may include a transparent conductive material.

The first connection wiring TWL1 and the second connection wiring TWL2 may be located on or at the same layer, or may be located on or at different layers. When the first connection wiring TWL1 and the second connection wiring TWL2 are located on or at different layers, the first connection wiring TWL1 and the second connection wiring TWL2 may be connected to each other through a contact hole.

The first connection wiring TWL1 may have a higher conductivity than a conductivity of the second connection wiring TWL2. Because the first connection wiring TWL1 is located in the peripheral area NDA and thus does not need to ensure a light transmittance, the first connection wiring TWL1 may include a material having a lower light transmittance but a higher conductivity than a material of the second connection wiring TWL2. Accordingly, a resistance value of the connection wiring TWL may be reduced.

As shown in FIG. 5B, lengths of the plurality of second connection wirings TWL2 may be the same. For example, ends of the plurality of second connection wirings TWL2 may extend to the opposite boundary of the component area CA where the auxiliary pixel circuits PCa are located. This may be for matching electrical loads due to the second connection wirings TWL2. Accordingly, luminance deviation in the component area CA may be minimized or reduced. The number of second connection wirings TWL2 of the component area CA may be the same as the number of auxiliary pixel circuits PCa.

In the illustrated embodiment, a first conductive layer MM1 may overlap the auxiliary sub-pixel Pa located in the component area CA. When the first conductive layer MM1 is described as overlapping (e.g., overlapping in the z direction or the thickness direction of the substrate 100) the auxiliary sub-pixel Pa, it may refer to the first conductive layer MM1 overlapping (e.g., overlapping in the z direction or the thickness direction of the substrate 100) the auxiliary display element EDa.

The first conductive layer MM1 may have a plurality of holes. In an embodiment, the first conductive layer MM1 may have a mesh structure. The first conductive layer MM1 may include a reflective metal film including silver (Ag), magnesium (Mg), aluminum (Al), platinum (Pt), palladium (Pd), gold (Au), nickel (Ni), neodymium (Nd), iridium (Ir), chromium (Cr), or a compound thereof.

As described above, the auxiliary sub-pixels Pa may include the first sub-pixel Pr', the second sub-pixel Pg', and the third sub-pixel Pb' emitting light of different colors from each other, and the first sub-pixel Pr', the second sub-pixel Pg', and the third sub-pixel Pb' may have different sizes from each other. Because the first conductive layer MM1 overlaps (e.g., overlaps in the z direction or the thickness direction of the substrate 100) each of the first sub-pixel Pr', the second sub-pixel Pg', and the third sub-pixel Pb', a size (e.g., an area) of the first conductive layer MM1 may be different for each of the auxiliary sub-pixels Pa.

The component area CA includes the transmissive area TA as described above, and an image may be captured when an image is formed due to light incident on the component 40 through the transmissive area TA.

In a comparative example, part of light passing through the transmissive area TA may be reflected, refracted, and diffracted by a portion of the component 40, (e.g., a camera lens), and may re-enter the portion of the component 40 (e.g., the camera lens). In this case, the reflected light may be incident on the component 40. Because the reflected light has certain noise, the component 40 may have distorted information. For example, when the component 40 is a camera including an image sensor, an image captured by the camera may be different from an actual image. As such, as the reflected light re-enters the camera lens, ghosting in which an unintended double image different from an actual image is formed may occur.

Accordingly, in the display apparatus 1 according to an embodiment, the first conductive layer MM1 overlaps (e.g., overlaps in the z direction or the thickness direction of the substrate 100) the auxiliary sub-pixel Pa located in the component area CA. Accordingly, because light passing through a transmissive area and reflected, refracted, and reflected by a component is scattered by the first conductive layer MM1, the reflected light may be prevented or substantially prevented from re-entering the component, thereby improving the reliability of information output from the component 40. In other words, the reflected light that may re-enter the component 40 may be minimized or reduced.

Figure 6:
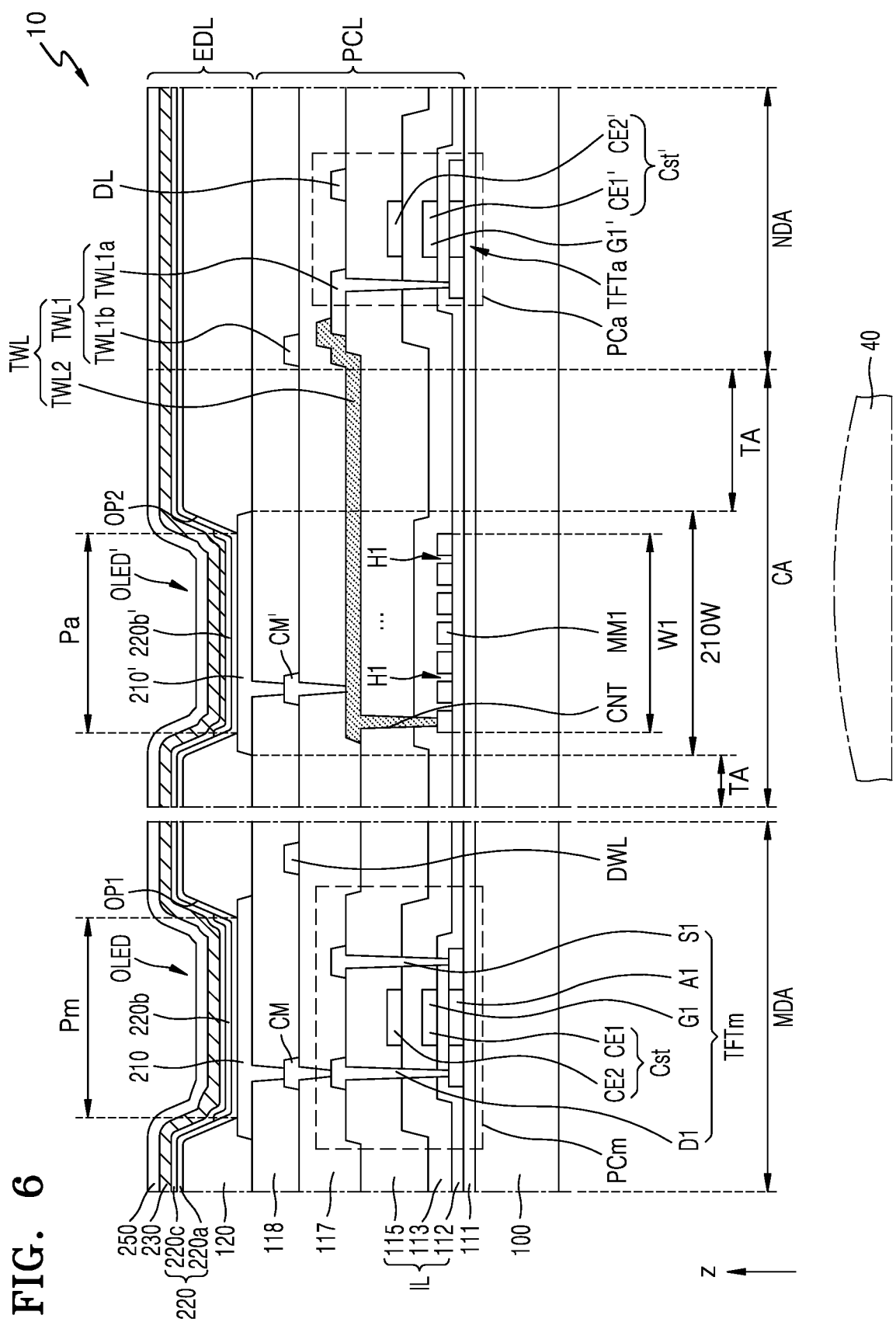
FIG. 6 is a cross-sectional view illustrating a part of a display apparatus according to an embodiment.
Figure 7:
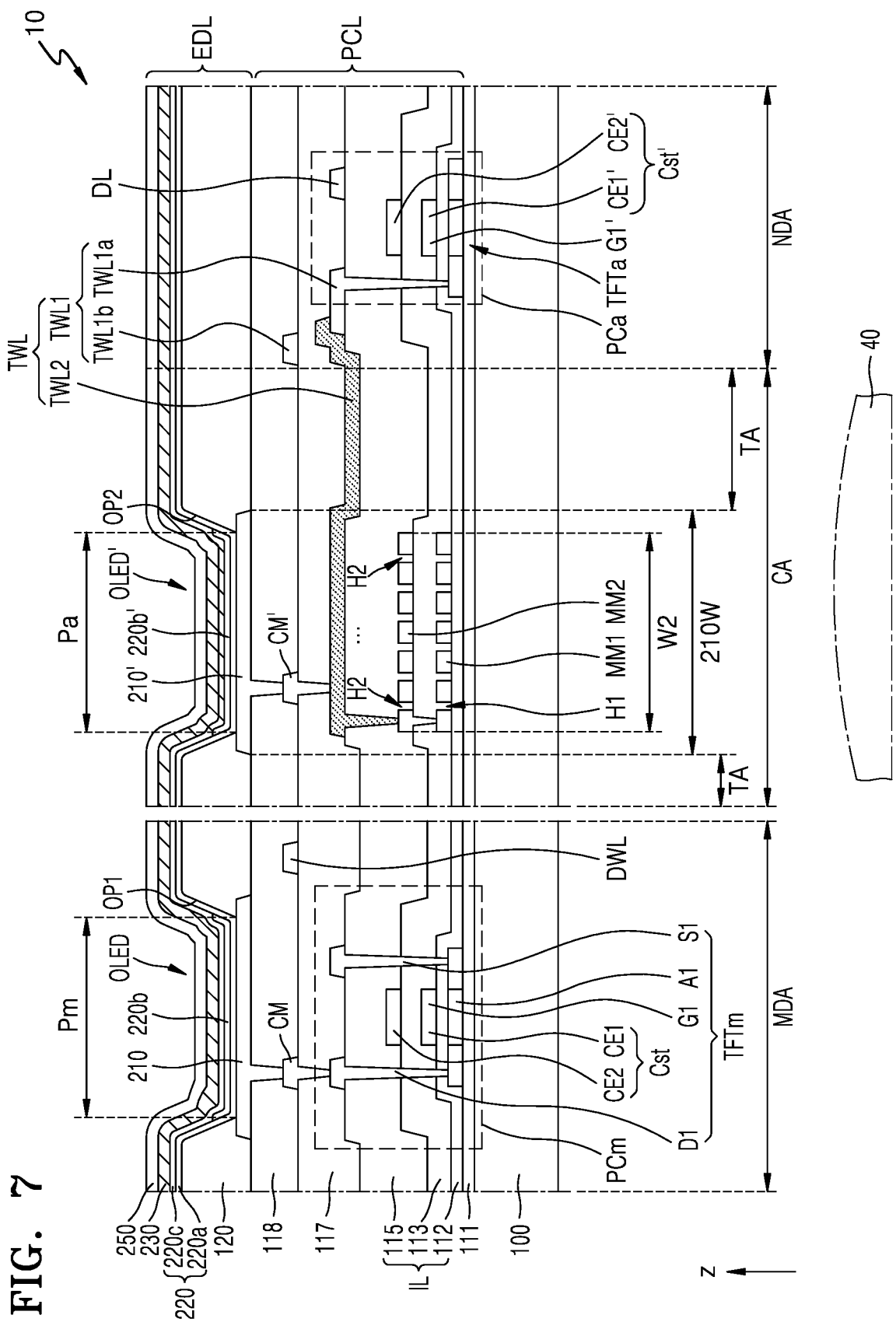
FIGS. 7 and 8 are cross-sectional views illustrating a part of a display apparatus according to one or more embodiments.
Figure 8:
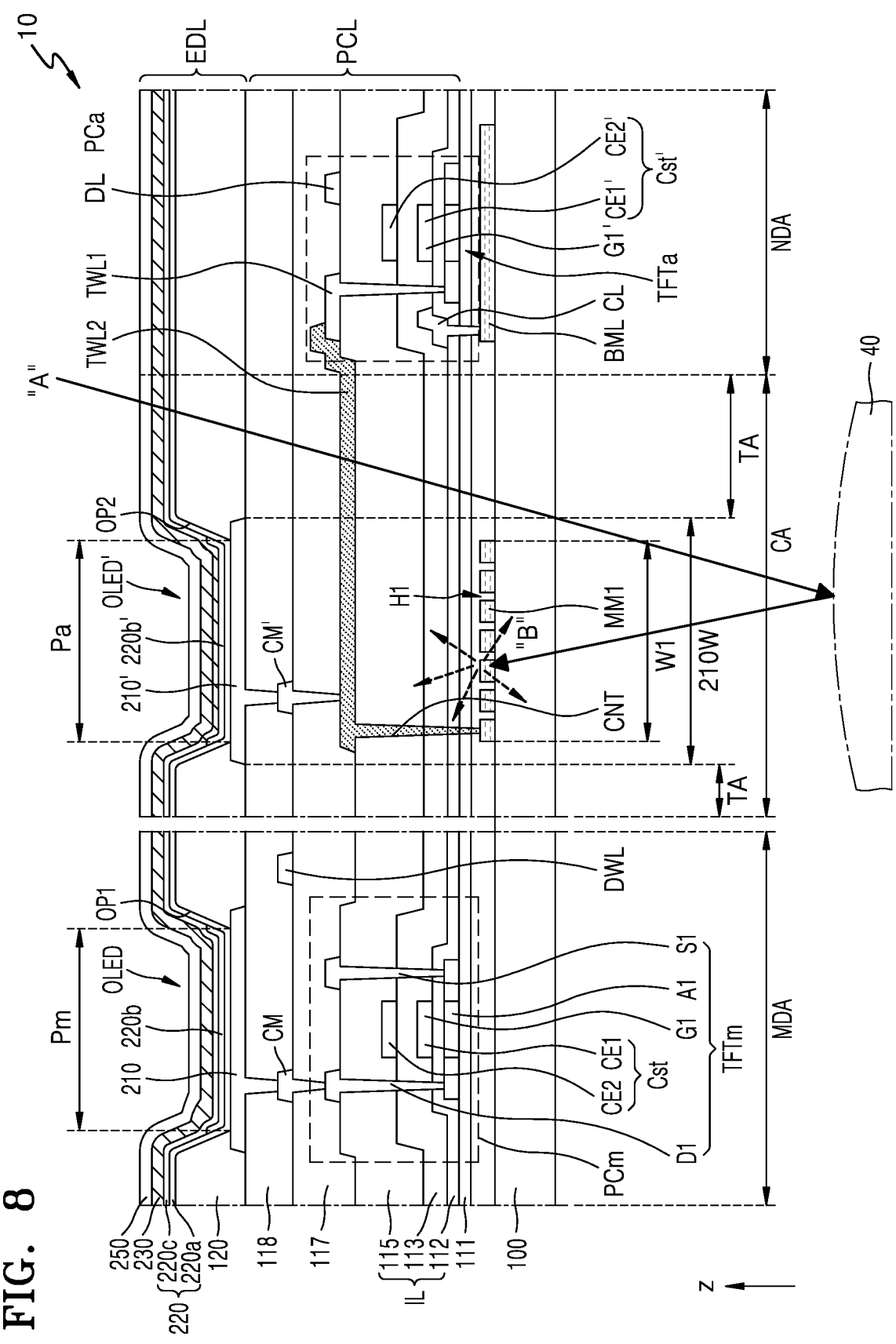

FIG. 6 is a cross-sectional view illustrating a part of a display apparatus according to an embodiment. FIGS. 7 and 8 are cross-sectional views illustrating a part of a display apparatus according to one or more embodiments.

FIG. 6 is a cross-sectional view illustrating a part of the display panel 10 according to an embodiment, especially illustrating parts of the main display area MDA, the component area CA, and the peripheral area NDA.

The main sub-pixel Pm is located in the main display area MDA, and the auxiliary sub-pixel Pa and the transmissive area TA are located in the component area CA. In the main display area MDA, the main pixel circuit PCm including a main thin-film transistor TFTm and a main storage capacitor Cst, and a main organic light-emitting diode OLED that is a display element connected to the main pixel circuit PCm may be located. In the component area CA, an auxiliary organic light-emitting diode OLED' may be located. In the peripheral area NDA, the auxiliary pixel circuit PCa including an auxiliary thin-film transistor TFTa and an auxiliary storage capacitor Cst' may be located. In the component area CA and the peripheral area NDA, the connection wiring TWL that connects the auxiliary pixel circuit PCa to the auxiliary organic light-emitting diode OLED' may be located.

A structure in which elements of the display panel 10 are stacked will now be described. The display panel 10 may include the substrate 100, a buffer layer 111, the circuit layer PCL, and the display element layer EDL which are stacked.

The substrate 100 may be formed of an insulating material such as glass, quartz, or a polymer resin. The substrate 100 may be a rigid substrate, or a flexible substrate that is bendable, foldable, and/or rollable.

The buffer layer 111 may be located on the substrate 100, and may reduce or prevent penetration of a foreign material, moisture, or external air from the bottom of the substrate 100 and may planarize the substrate 100. The buffer layer 111 may include an inorganic material such as oxide or nitride, an organic material, or a combination of an organic material and an inorganic material, and may have a single layer structure or a multi-layer structure including an inorganic material and an organic material. A barrier layer may be further provided between the substrate 100 and the buffer layer 111 to reduce or prevent penetration of external air. In an embodiment, the buffer layer 111 may include silicon oxide ($SiO_2$) silicon nitride ($SiN_x$), or silicon oxynitride (SiON).

The circuit layer PCL may be located on the buffer layer 111, and may include the main and auxiliary pixel circuits PCm and PCa, a first gate insulating layer 112, a second gate insulating layer 113, an interlayer insulating layer 115, and first and second planarization layers 117 and 118. The main pixel circuit PCm may include the main thin-film transistor TFTm and the main storage capacitor Cst, and the auxiliary pixel circuit PCa may include the auxiliary thin-film transistor TFTa and the auxiliary storage capacitor Cst'.

The main thin-film transistor TFTm and the auxiliary thin-film transistor TFTa may be located on the buffer layer 111. The main thin-film transistor TFTm may include a semiconductor layer A1, a gate electrode G1, a source electrode S1, and a drain electrode D1. The main thin-film transistor TFTm may be connected to the main organic light-emitting diode OLED and may drive the main organic light-emitting diode OLED. The auxiliary thin-film transistor TFTa may be connected to the auxiliary organic light-emitting diode OLED' and may drive the auxiliary organic light-emitting diode OLED'. The auxiliary thin-film transistor TFTa has a structure similar to a structure of the main thin-film transistor TFTm, and thus the same or a similar description of the main thin-film transistor TFTm may apply to the auxiliary thin-film transistor TFTa.

The semiconductor layer A1 may be located on the buffer layer 111, and may include polysilicon. In one or more other embodiments, the semiconductor layer A1 may include amorphous silicon. In one or more other embodiments, the semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include a channel region, and a source region and a drain region doped with impurities.

The first gate insulating layer 112 may be provided to cover the semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may have a single layer structure or a multi-layer structure including the inorganic insulating material.

The gate electrode G1 is located on the first gate insulating layer 112 to overlap the semiconductor layer A1. The gate electrode G1 may include molybdenum (Mo), aluminum (Al), copper (Cu), or titanium (Ti), and may have a single layer structure or a multi-layer structure. For example, the gate electrode G1 may have a single layer structure including Mo.

The second gate insulating layer 113 may be provided to cover the gate electrode G1. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may have a single layer structure or a multi-layer structure including the inorganic insulating material.

An upper electrode CE2 of the main storage capacitor Cst and an upper electrode CE2' of the auxiliary storage capacitor Cst' may be located on the second gate insulating layer 113.

In the main display area MDA, the upper electrode CE2 of the main storage capacitor Cst may overlap the gate electrode G1 located under the upper electrode CE2. The gate electrode G1 and the upper electrode CE2 overlapping each other with the second gate insulating layer 113 therebetween may constitute the main storage capacitor Cst. The gate electrode G1 may be a lower electrode CE1 of the main storage capacitor Cst.

In the peripheral area NDA, the upper electrode CE2' of the auxiliary storage capacitor Cst' may overlap a gate electrode G1' of the auxiliary thin-film transistor TFTa. The gate electrode G1' of the auxiliary thin-film transistor TFTa may be a lower electrode CE1' of the auxiliary storage capacitor Cst'.

Each of the upper electrodes CE2 and CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer structure or a multi-layer structure including the above material.

The interlayer insulating layer 115 may be formed to cover the upper electrodes CE2 and CE2'. The interlayer insulating layer 115 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may have a single layer structure or a multi-layer structure including the inorganic insulating material.

The source electrode S1 and the drain electrode D1 may be located on the interlayer insulating layer 115. Each of the source electrode S1 and the drain electrode D1 may include a conductive material including molybdenum (Mo), aluminum (Al), copper (Cu), or titanium (Ti), and may have a single layer structure or a multi-layer structure including the above material. For example, each of the source electrode S1 and the drain electrode D1 may have a multi-layer structure including Ti/Al/Ti.

The connection wiring TWL connected to the auxiliary pixel circuit PCa may be located on the interlayer insulating layer 115. The connection wiring TWL may extend from the peripheral area NDA to the component area CA, and may connect the auxiliary organic light-emitting diode OLED' to the auxiliary pixel circuit PCa. Also, the data line DL may be located on the interlayer insulating layer 115.

In an embodiment, the connection wiring TWL may include the first connection wiring TWL1 and the second connection wiring TWL2. In the cross-sectional views of FIGS. 7 and 8 in addition to FIG. 6, the connection wiring TWL may correspond to the connection wiring TWL of FIG. 5B.

The first connection wiring TWL1 may be located in the peripheral area NDA, and may be connected to the auxiliary pixel circuit PCa, for example, the auxiliary thin-film transistor TFTa. The second connection wiring TWL2 may be connected to the first connection wiring TWL1, and may be located in the transmissive area TA of the component area CA. The second connection wiring TWL2 and the first connection wiring TWL1 may be located on or at the same layer, and may include different materials from each other. An end of the second connection wiring TWL2 may cover an end of the first connection wiring TWL1.

In one or more other embodiments, the first connection wiring TWL1 and the second connection wiring TWL2 may be located on or at different layers. In an embodiment, the first connection wiring TWL1 (e.g., a $1\text{-}1^{th}$ connection wiring TWL1a of the first connection wiring TWL1) may be located on the interlayer insulating layer 115 as shown in FIG. 6, and the second connection wiring TWL2 may be located on the first planarization layer 117. In this case, the first connection wiring TWL1 (e.g., the 1-1th connection wiring TWL1a of the first connection wiring TWL1) and the second connection wiring TWL2 may be connected to each other through a contact hole defined in or through the first planarization layer 117.

The first connection wiring TWL1 may include a conductive material including molybdenum (Mo), aluminum (Al), copper (Cu), or titanium (Ti), and may have a single layer structure or a multi-layer structure including the above material. The first connection wiring TWL1 may include the $1\text{-}1^{th}$ connection wiring TWL1a and the $1\text{-}2^{th}$ connection wiring TWL1b located on or at different layers. In an embodiment, the $1\text{-}1^{th}$ connection wiring TWL1a and the data line DL may be located on or at the same layer, and may include the same material. The $1\text{-}2^{th}$ connection wiring TWL1b and the $1\text{-}1^{th}$ connection wiring TWL1a may be located with the first planarization layer 117 therebetween. The $1\text{-}2^{th}$ connection wiring TWL1b and connection electrodes CM and CM' may be located on the first planarization layer 117. In one or more other embodiments, the $1\text{-}2^{th}$ connection wiring TWL1b may be located on or at the same layer as the upper electrode CE2 or the lower electrode CE1 of the main storage capacitor Cst.

The second connection wiring TWL2 may include a transparent conductive material. For example, the connection wiring TWL may include a transparent conductive oxide (TCO). The connection wiring TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The first connection wiring TWL1 may have a higher conductivity than a conductivity of the second connection wiring TWL2. Because the first connection wiring TWL1 is located in the peripheral area NDA and thus does not need to secure a light transmittance, the first connection wiring TWL1 may include a material having a lower light transmittance and a higher conductivity than a conductivity of the second connection wiring TWL2. Accordingly, a resistance value of the connection wiring TWL may be minimized or reduced.

The first and second planarization layers 117 and 118 may be located to cover the source electrodes S1 and S2, the drain electrodes D1 and D2, and the connection wiring TWL. The first and second planarization layers 117 and 118 may have a flat top surface so that a main pixel electrode 210 and an auxiliary pixel electrode 210' located on the first and second planarization layers 117 and 118 are flat.

Each of the first and second planarization layers 117 and 118 may include an organic material or an inorganic material, and may have a single layer structure or a multi-layer structure. The first and second planarization layers 117 and 118 may include the first planarization layer 117 and the second planarization layer 118. Accordingly, a conductive pattern such as a wiring may be formed between the first planarization layer 117 and the second planarization layer 118, which may lead to high integration. The connection electrodes CM and CM' and the data connection line DWL may be located on the first planarization layer 117.

The first planarization layer 117 may include benzocyclobutene (BCB), polyimide, hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, and/or a vinyl alcohol-based polymer. The first planarization layer 117 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). When the first planarization layer 117 is formed, a layer may be formed and then chemical mechanical polishing may be performed on a top surface of the layer in order to provide a flat top surface.

The first planarization layer 117 may be located to cover the main and auxiliary pixel circuits PCm and PCa. The second planarization layer 118 may be located on the first planarization layer 117, and may have a flat top surface so that the main and auxiliary pixel electrodes 210 and 210' are flat.

The main and auxiliary organic light-emitting diodes OLED and OLED' are located on the second planarization layer 118. The main and auxiliary pixel electrodes 210 and 210' of the main and auxiliary organic light-emitting diodes OLED and OLED' may be connected to the main and auxiliary pixel circuits PCm and PCa through the connection electrodes CM and CM' located on the first planarization layer 117.

Each of the main pixel electrode 210 and the auxiliary pixel electrode 210' may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). Each of the main pixel electrode 210 and the auxiliary pixel electrode 210' may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, each of the main pixel electrode 210 and the auxiliary pixel electrode 210' may have a structure in which films formed of ITO, IZO, ZnO, or $In_2O_3$ are located over/under the reflective film. In this case, each of the main pixel electrode 210 and the auxiliary pixel electrode 210' may have a stacked structure including ITO/Ag/ITO.

A pixel-defining layer 120 located on the first planarization layer 117 (e.g., the pixel-defining layer 120 located on the first planarization layer 117 with the second planarization layer 118 therebetween) may cover edges of the main pixel electrode 210 and the auxiliary pixel electrode 210', and may have a first opening OP1 and a second opening OP2 through which central portions of the main pixel electrode 210 and the auxiliary pixel electrode 210' are exposed. Sizes and shapes of emission areas, that is, the main and auxiliary sub-pixels Pm and Pa, of the main and auxiliary organic light-emitting diodes OLED and OLED' are defined by the first opening OP1 and the second opening OP2.

The pixel-defining layer 120 may increase a distance between edges of the main pixel electrode 210 and a counter electrode 230 (e.g., a portion of the counter electrode 230) located over the main pixel electrode 210, and may increase a distance between edges of the auxiliary pixel electrode 210' and the counter electrode 230 (e.g., a portion of the counter electrode 230) located over the auxiliary pixel electrode 210', to prevent or substantially prevent an arc or the like from occurring on the edges of the main pixel electrode 210 and the auxiliary pixel electrode 210'. The pixel-defining layer 120 may be formed of an organic insulating material such as polyimide, polyamide, acrylic resin, benzocyclobutene, hexamethyldisiloxane (HMDSO), and/or phenolic resin, by using spin coating or the like.

A main emission layer 220b and an auxiliary emission layer 220b' are respectively located in the first opening OP1 and the second opening OP2 of the pixel-defining layer 120 to respectively correspond to the main pixel electrode 210 and the auxiliary pixel electrode 210'. Each of the main emission layer 220b and the auxiliary emission layer 220b' may include a high molecular weight material or a low molecular weight material, and may emit red light, green light, blue light, or white light.

An organic functional layer 220 may be located over and/or under the main emission layer 220b and the auxiliary emission layer 220b'. The organic functional layer 220 may include a first functional layer 220a and/or a second functional layer 220c. The first functional layer 220a or the second functional layer 220c may be omitted.

The first functional layer 220a may be located under the main emission layer 220b and the auxiliary emission layer 220b'. The first functional layer 220a may have a single layer structure or a multi-layer structure including an organic material. The first functional layer 220a may be a hole transport layer (HTL) having a single layer structure. Alternatively, the first functional layer 220a may include a hole injection layer (HIL) and a hole transport layer (HTL). The first functional layer 220a may be integrally formed to correspond to the main and auxiliary organic light-emitting diodes OLED and OLED' included in the main display area MDA and the component area CA, respectively.

The second functional layer 220c may be located on the main emission layer 220b and the auxiliary emission layer 220b'. The second functional layer 220c may have a single layer structure or a multi-layer structure including an organic material. The second functional layer 220c may include an electron transport layer (ETL) and/or an electron injection layer (EIL). The second functional layer 220c may be integrally formed to correspond to the main and auxiliary organic light-emitting diodes OLED and OLED' included in the main display area MDA and the component area CA, respectively.

The counter electrode 230 is located on the second functional layer 220c. The counter electrode 230 may include a conductive material having a low work function. For example, the counter electrode 230 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 230 may further include a layer formed of ITO, IZO, ZnO, or $In_2O_3$ on the (semi-)transparent layer including the above material. The counter electrode 230 may be integrally formed to correspond to the main and auxiliary organic light-emitting diodes OLED and OLED' included in the main display area MDA and the component area CA respectively.

Layers from the main pixel electrode 210 to the counter electrode 230 formed in the main display area MDA may constitute the main organic light-emitting diode OLED. Layers from the auxiliary pixel electrode 210' to the counter electrode 230 formed in the component area CA may constitute the auxiliary organic light-emitting diode OLED'.

An upper layer 250 including an organic material may be formed on the counter electrode 230. The upper layer 250 may protect the counter electrode 230 and may improve light extraction efficiency. The upper layer 250 may include an organic material having a higher refractive index than a refractive index of the counter electrode 230. Alternatively, the upper layer 250 may be formed by stacking layers having different refractive indexes from each other. For example, the upper layer 250 may be formed by stacking (e.g., by sequentially stacking) a high refractive index layer, a low refractive index layer, and a high refractive index layer. In this case, a refractive index of the high refractive index layer may be equal to or greater than 1.7, and a refractive index of the low refractive index layer may be equal to or less than 1.3.

The upper layer 250 may additionally include LiF. Alternatively, the upper layer 250 may additionally include an inorganic insulating material such as silicon oxide ($SiO_2$) or silicon nitride (SiNx).

The first conductive layer MM1 may overlap the auxiliary sub-pixel Pa in the component area CA. This may refer to the first conductive layer MM1 overlapping (e.g., overlapping in the z direction or the thickness direction of the substrate 100) an auxiliary display element, that is, the auxiliary organic light-emitting diode OLED'. In the illustrated embodiment, because the auxiliary organic light-emitting diode OLED' of the auxiliary sub-pixel Pa is located in the component area CA and the auxiliary pixel circuit PCa is located in the peripheral area NDA, the first conductive layer MM1 may overlap the auxiliary organic light-emitting diode OLED'. In this case, when the first conductive layer MM1 overlaps the auxiliary organic light-emitting diode OLED', it may refer to the first conductive layer MM1 overlapping (e.g., overlapping in the z direction or the thickness direction of the substrate 100) the auxiliary pixel electrode 210'.

A plurality of first holes H1 may be formed in the first conductive layer MM1. The plurality of first holes H1 may pass through the first conductive layer MM1. The plurality of first holes H1 may have any of various suitable shapes such as a polygonal shape (e.g., a quadrangular shape), a circular shape, an elliptical shape, a bar shape, or an irregular shape. Also, the plurality of first holes H1 may be arranged in any of various suitable structures such as a matrix structure, a checker structure, a stripe structure, or a random structure.

The first conductive layer MM1 may be located between the substrate 100 and a connection wiring (e.g., the second connection wiring TWL2). In an embodiment, as shown in FIG. 6, the first conductive layer MM1 may be located on the first gate insulating layer 112, and may include the same material as that of the gate electrodes G1 and G1' of the main and auxiliary pixel circuits PCm and PCa. In one or more other embodiments, the first conductive layer MM1 may be located on the second gate insulating layer 113, and in this case, may include the same material as that of the upper electrodes CE2 and CE2'. In one or more other embodiments, the first conductive layer MM1 may be located between a connection wiring (e.g., the second connection wiring TWL2) and the auxiliary pixel electrode 210'. In this case, the first conductive layer MM1 may include the same material as that of the connection electrodes CM and CM'. As long as the first conductive layer MM1 is located between the substrate 100 and the auxiliary pixel electrode 210' to correspond to the auxiliary pixel electrode 210', the first conductive layer MM1 may be implemented in various suitable ways as described above.

In an embodiment, a width W1 of the first conductive layer MM1 may be the same as a width 210W of the auxiliary pixel electrode 210', or the width W1 of the first conductive layer MM1 may be less than the width 210W of the auxiliary pixel electrode 210'. That is, an orthogonal projection image of the first conductive layer MM1 onto the substrate 100 may completely overlap the auxiliary pixel electrode 210'. In other words, the first conductive layer MM1 may completely overlap the auxiliary pixel electrode 210' in a plan view. Accordingly, the area of the first conductive layer MM1 may be less than the area of the auxiliary pixel electrode 210'. For example, the area of the first conductive layer MM1 may be less than the area of the auxiliary pixel electrode 210' in a plan view.

In a comparative example, when a width of a first conductive layer is greater than a width of an auxiliary pixel electrode, a pattern of the first conductive layer may be exposed to the outside of the auxiliary sub-pixel Pa, thereby reducing visibility. Rather, reflected light may be re-reflected by the first conductive layer and may re-enter a component, thereby exacerbating ghosting in which an unintended double image is formed.

The first conductive layer MM1 may be connected (e.g., electrically connected) to a wiring or an electrode, so that a signal or a constant voltage is applied. Referring to FIG. 6, the first conductive layer MM1 may be connected (e.g., electrically connected) to the second connection wiring TWL2 through a contact hole CNT. In one or more other embodiments, the first conductive layer MM1 may be isolated without being connected to another wiring or electrode. However, in this case, because static electricity generated by the first conductive layer MM1 may affect adjacent pixel circuits, it is preferable that a signal or a constant voltage is applied.

FIGS. 7 and 8 are cross-sectional views illustrating a part of a display apparatus according to one or more embodiments. FIGS. 7 and 8 illustrate modifications of the component area CA of FIG. 6, in other words, the first conductive layer MM1 located in the component area CA. Other elements are the same as those in FIG. 6, and thus a description thereof may not be repeated and the following description may primarily focus on differences.

Referring to FIG. 7, a second conductive layer MM2 may be further provided over the first conductive layer MM1. A plurality of second holes H2 may be formed in the second conductive layer MM2. The plurality of second holes H2 may pass through the second conductive layer MM2. The plurality of second holes H2 may have any of various suitable shapes such as a polygonal shape (e.g., a quadrangular shape), a circular shape, an elliptical shape, a bar shape, or an irregular shape. Also, the plurality of second holes H2 may be arranged in any of various suitable structures such as a matrix structure, a checker structure, a stripe structure, or a random structure. The second conductive layer MM2 and the first conductive layer MM1 may have the same shape or may have different shapes from each other.

As described above, a width W2 of the second conductive layer MM2 may be equal to or less than the width 210W of the auxiliary pixel electrode 210'. An orthogonal projection image of the second conductive layer MM2 onto the substrate 100 may completely overlap the auxiliary pixel electrode 210'. In other words, the second conductive layer MM2 may completely overlap the auxiliary pixel electrode 210' in a plan view. Accordingly, the area of the second conductive layer MM2 may be less than the area of the auxiliary pixel electrode 210'. For example, the area of the second conductive layer MM2 may be less than the area of the auxiliary pixel electrode 210' in a plan view.

The second conductive layer MM2 may be located on the second gate insulating layer 113. In this case, the second conductive layer MM2 may include the same material as that of the upper electrodes CE2 and CE2'.

The second conductive layer MM2 may be connected (e.g., electrically connected) to a wiring or an electrode, so that a signal or a constant voltage is applied. In an embodiment, as shown in FIG. 7, the second conductive layer MM2 may be connected (e.g., electrically connected) to the second connection wiring TWL2 through a second contact hole CNT2, and the first conductive layer MM1 may be connected (e.g., electrically connected) to the second conductive layer MM2 through a first contact hole CNT1.

Referring to FIG. 8, the bottom metal layer BML may be provided under the auxiliary pixel circuit PCa located in the peripheral area NDA. The bottom metal layer BML may include a conductive metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

The bottom metal layer BML may be connected (e.g., electrically connected) to a conductive line CL. The conductive line CL may be connected (e.g., electrically connected) to one electrode of the auxiliary thin-film transistor TFTa, or may be connected (e.g., electrically connected) to one electrode of the auxiliary storage capacitor Cst'. Alternatively, the conductive line CL may be connected (e.g., electrically connected) to a driving voltage line. The bottom metal layer BML connected to the conductive line CL may protect the auxiliary thin-film transistor TFTa from external static electricity or may block the influence of the component 40, thereby improving the performance of the auxiliary thin-film transistor TFTa.

In the illustrated embodiment, the first conductive layer MM1 and the bottom metal layer BML may be located on or at the same layer. In this case, the first conductive layer MM1 may include the same material as a material of the bottom metal layer BML. The first conductive layer MM1 may be located directly on the substrate 100, and may be located below the second connection wiring TWL2. The first conductive layer MM1 may be connected (e.g., electrically connected) to the second connection wiring TWL2 through the contact hole CNT.

Referring to FIG. 8, part of light passing through the transmissive area TA may travel along a path "A", and thus may be reflected, refracted, and diffracted by the component 40, for example, a camera lens. The reflected light may travel along a path "B" toward the auxiliary sub-pixel Pa. In this case, the light traveling along the path "B" may be scattered in the display panel 10 by the first conductive layer MM1.

In a comparative example where a display apparatus does not include the first conductive layer MM1, light traveling along the path "B" toward the auxiliary sub-pixel Pa may be re-reflected by the auxiliary pixel electrode 210'. In this case, the re-reflected light may re-enter the component 40. Because the re-reflected light includes certain noise, the component 40 may have distorted information. For example, when the component 40 is a camera including an image sensor, an image captured by the camera may be different from an actual image. As such, as the reflected light re-enters the camera lens, ghosting in which an unintended double image different from an actual image is formed may occur.

As described with reference to FIGS. 6-8, in the display apparatus according to an embodiment, because reflected light is scattered in the display panel by a light-scattering layer such as the first conductive layer MM1 and/or the second conductive layer MM2 located in the component area CA, the reflected light may be prevented or substantially prevented from re-entering the component 40. Accordingly, the reliability of information output from the component 40 may be improved.

FIGS. 9A-9E are plan views illustrating a shape of a first conductive layer according to an embodiment. Although a shape of the first conductive layer MM1 is described in FIGS. 9A-9E, the same description may apply to the second conductive layer MM2.

Figure 9A:
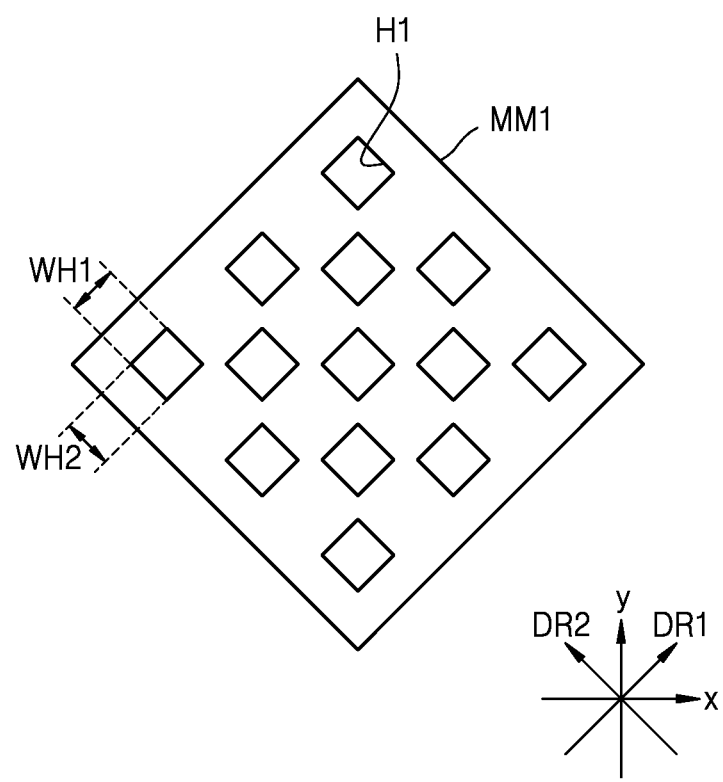
FIGS. 9A-9E are plan views illustrating a shape of a first conductive layer according to an embodiment.
Figure 9B:
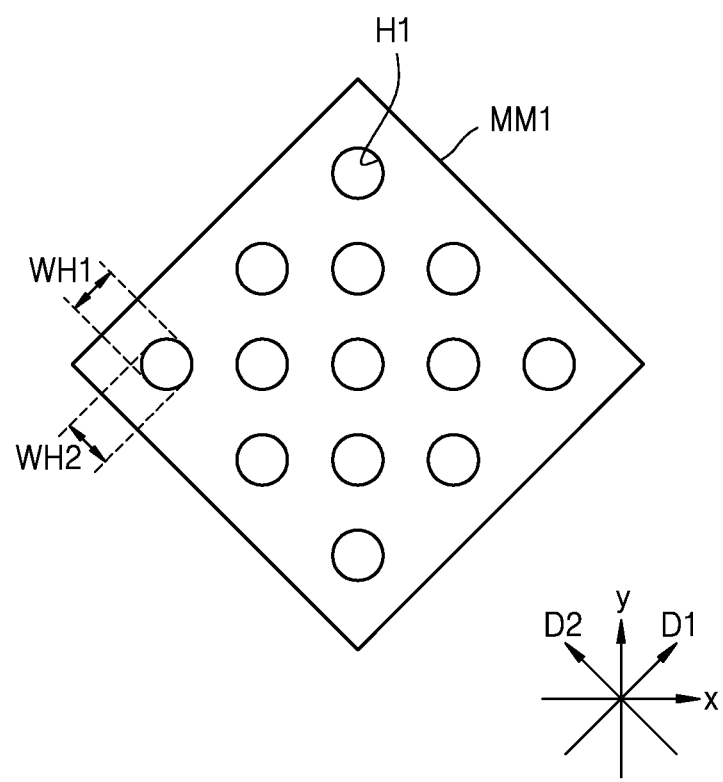
Figure 9C:
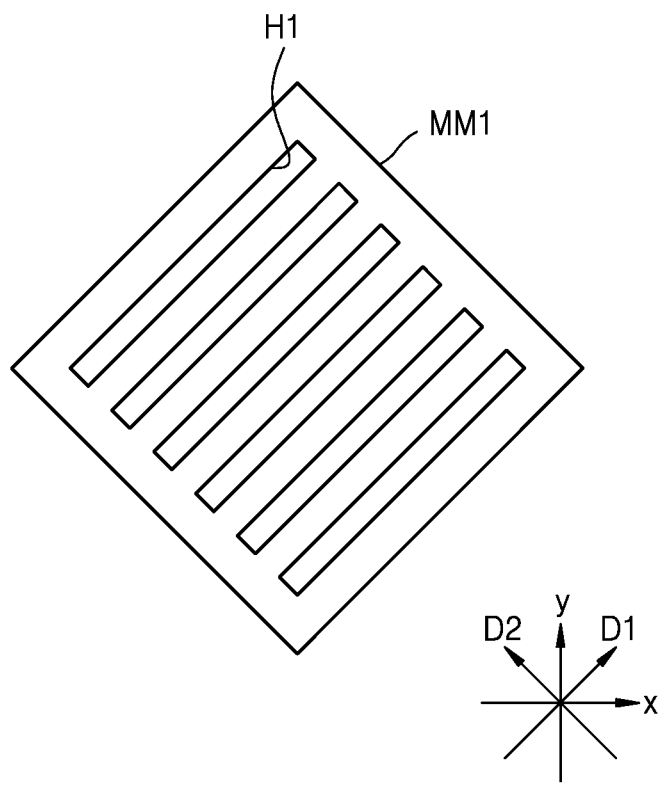
Figure 9D:
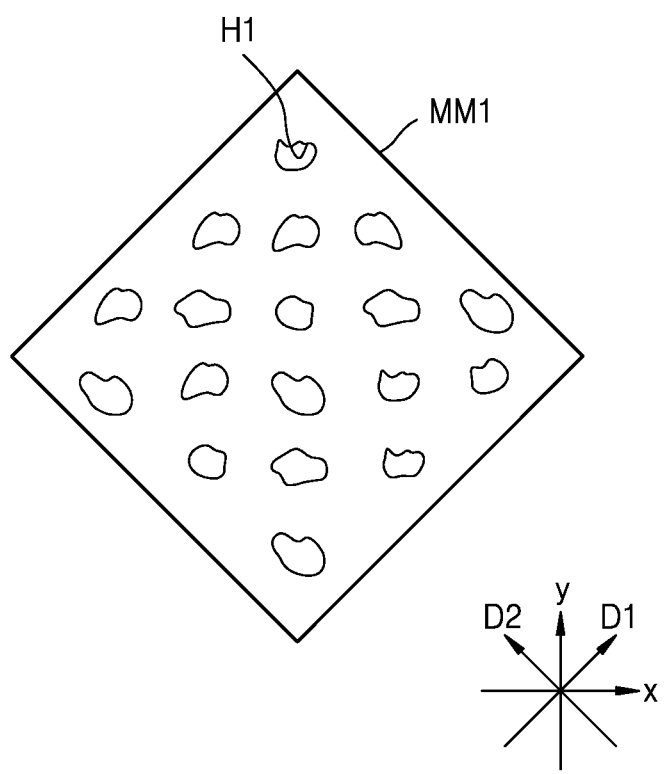
Figure 9E:
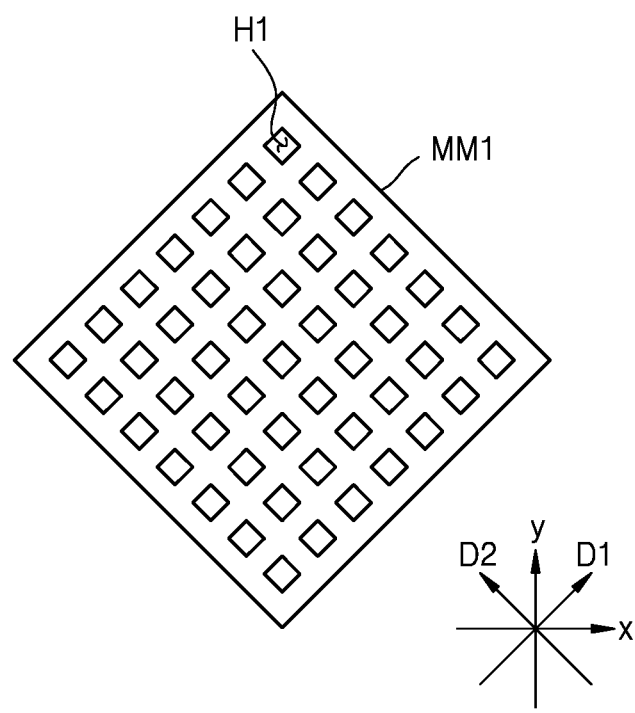

Referring to FIGS. 9A-9E, the plurality of first holes H1 may be formed in the first conductive layer MM1. The plurality of first holes H1 may pass through the first conductive layer MM1. The plurality of first holes H1 may have any of various suitable shapes such as a polygonal shape (e.g., a quadrangular shape) as shown in FIGS. 9A and 9E, a circular or elliptical shape as shown in FIG. 9B, a bar shape as shown in FIG. 9C, and/or an irregular shape as shown in FIG. 9D.

Also, the plurality of first holes H1 may be arranged in any of various suitable structures such as a checker structure as shown in FIGS. 9A and 9B, a stripe structure as shown in FIG. 9C, and/or a random structure as shown in FIG. 9D. Alternatively, the plurality of first holes H1 may be arranged in a matrix structure or a mesh structure in which the same number of first holes H1 are located in the same row and the same column.

In an embodiment, in FIGS. 9A and 9B, first and second widths WH1 and WH2 of each of the plurality of first holes H1 in a direction (e.g., a DR1 direction or a DR2 direction) may each be about 0.5 μm. For example, a width of the plurality of first holes H1 may range from about 0.5 μm to about 5 μm. Although the first and second widths WH1 and WH2 are the same in FIGS. 9A and 9B, the first and second widths WH1 and WH2 may be different from each other. When the first and second widths WH1 and WH2 are different from each other, the first hole H1 may have a rectangular shape or an elliptical shape.

Also, the area of the plurality of first holes H1 (e.g., the total area of all of the plurality of first holes H1) may be less than 50% of the total area of the first conductive layer MM1. In a comparative example, when the area of the first holes H1 is equal to or greater than 50% of the total area of the first conductive layer MM1, the effect of a mesh structure of the first conductive layer MM1 may be reduced.

Figure 10:
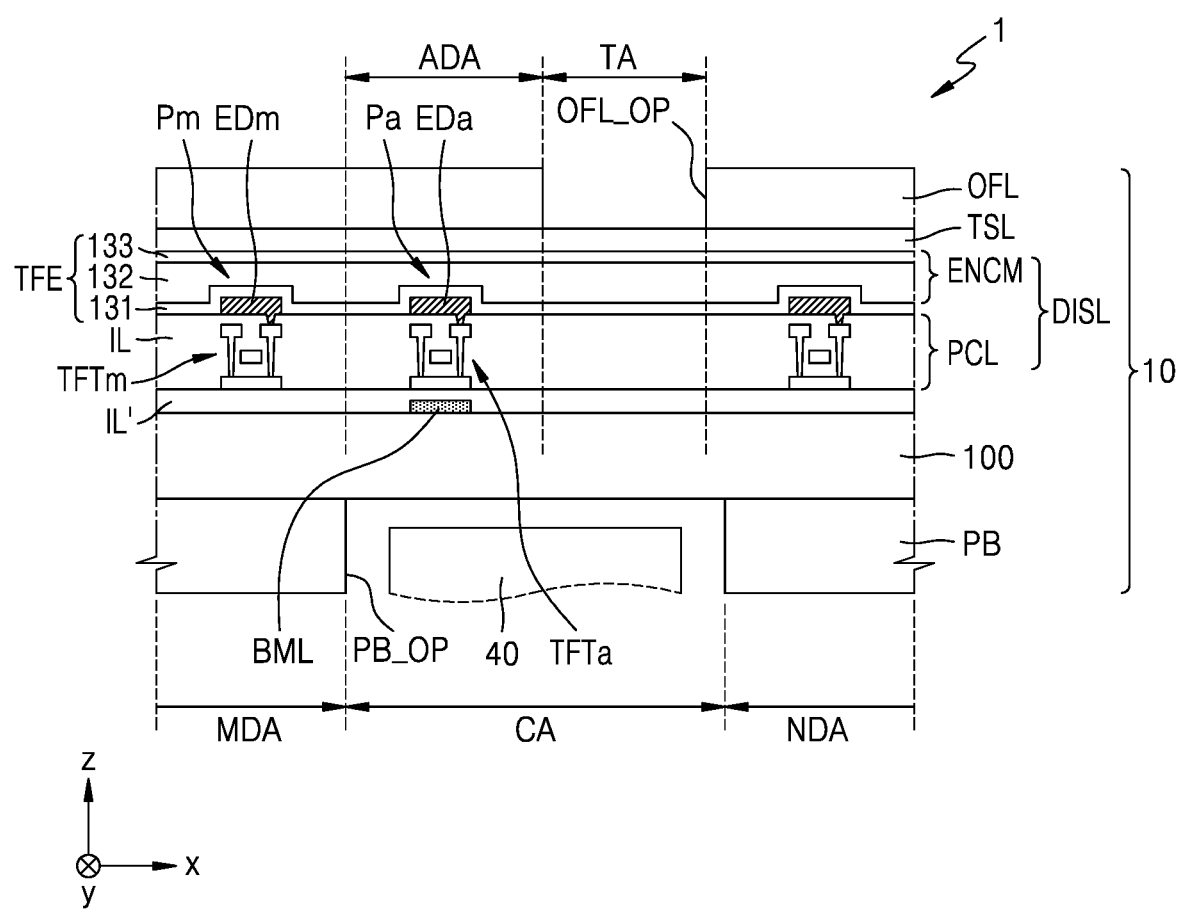
FIG. 10 is a cross-sectional view illustrating a part of a display apparatus according to one or more embodiments.
Figure 11:
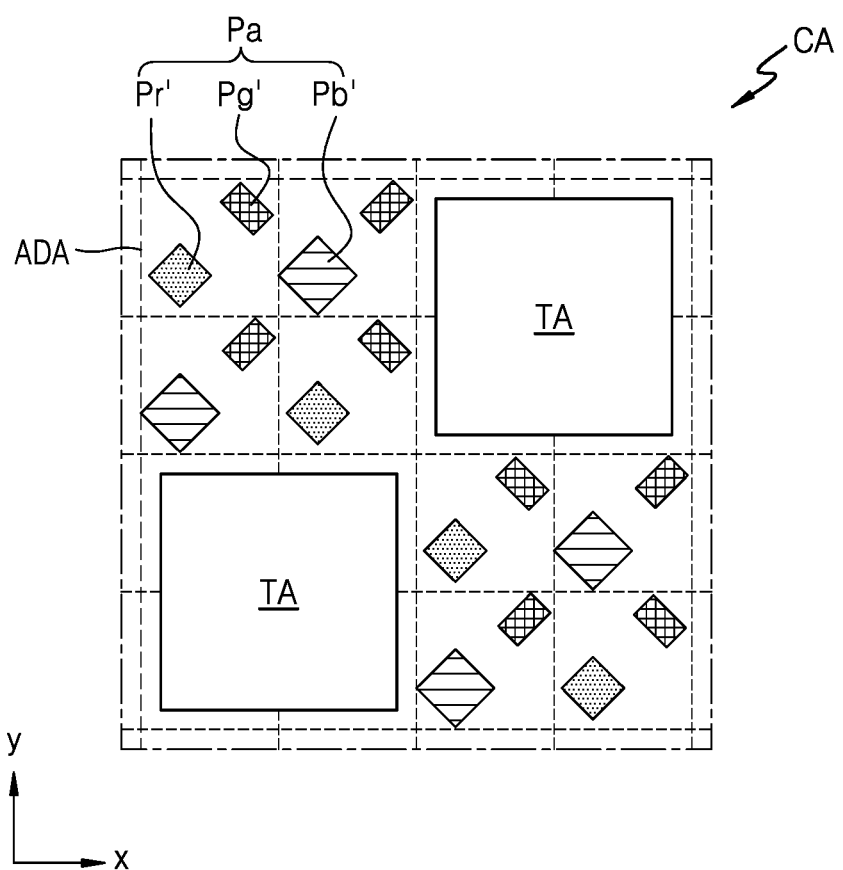
FIG. 11 is a plan view illustrating a part of a component area in the display apparatus of FIG. 10.

FIG. 10 is a cross-sectional view illustrating a part of a display apparatus according to one or more embodiments. FIG. 11 is a plan view illustrating a part of a component area of the display apparatus of FIG. 10.

The display apparatus 1 of FIG. 10 is a modification of the display apparatus 1 of FIG. 2A, and is different in a structure of the component area CA. The main display area MDA and a stacked structure are the same as those of FIG. 2A, and thus a description thereof may not be repeated and the component area CA will be mainly described.

The display panel 10 may include the substrate 100, the display layer DISL, the touchscreen layer TSL, and the optical functional layer OFL, which are located over the substrate 100, and the panel protection member PB, which is located under the substrate 100. In the component area CA of FIG. 10, the auxiliary sub-pixel Pa including the auxiliary display element EDa and the auxiliary pixel circuit PCa is located. The auxiliary pixel circuit PCa may be located under the auxiliary display element EDa to overlap (e.g., overlap in the z direction or the thickness direction of the substrate 100) the auxiliary display element EDa unlike in some of the above-described embodiments.

As shown in FIG. 11, the auxiliary sub-pixels Pa may include the first sub-pixel Pr', the second sub-pixel Pg', and the third sub-pixel Pb' emitting light of different colors from each other. In the component area CA, the auxiliary sub-pixels Pa may be grouped, to form a pixel area PXA in which the auxiliary sub-pixels Pa are located and the transmissive area TA in which a transmitter is located. In an embodiment, the pixel area PXA and the transmissive area TA may be alternately arranged in a lattice shape. While portions other than the auxiliary display element EDa in the component area CA are all used as the transmissive area TA in FIG. 2A, the transmissive area TA in the component area CA may be provided to have a specific shape in FIG. 11. In an embodiment, the transmissive area TA may have any of various suitable shapes such as a polygonal shape, a circular shape, or an irregular shape.

The bottom metal layer BML may be located between the substrate 100 and the auxiliary pixel circuit PCa to overlap (e.g., overlap in the z direction or the thickness direction of the substrate 100) the auxiliary pixel circuit PCa. The bottom metal layer BML may prevent or substantially prevent external light from reaching the auxiliary sub-pixel Pa.

The bottom metal layer BML according to the illustrated embodiment may be located to correspond to the thin-film transistor TFT included in the auxiliary pixel circuit PCa. In other words, the bottom metal layer BML may be patterned to be located in a portion where the thin-film transistor TFT is located and not to be located in other portions where an electrode, a voltage line, and/or a signal line is located.

Figure 12:
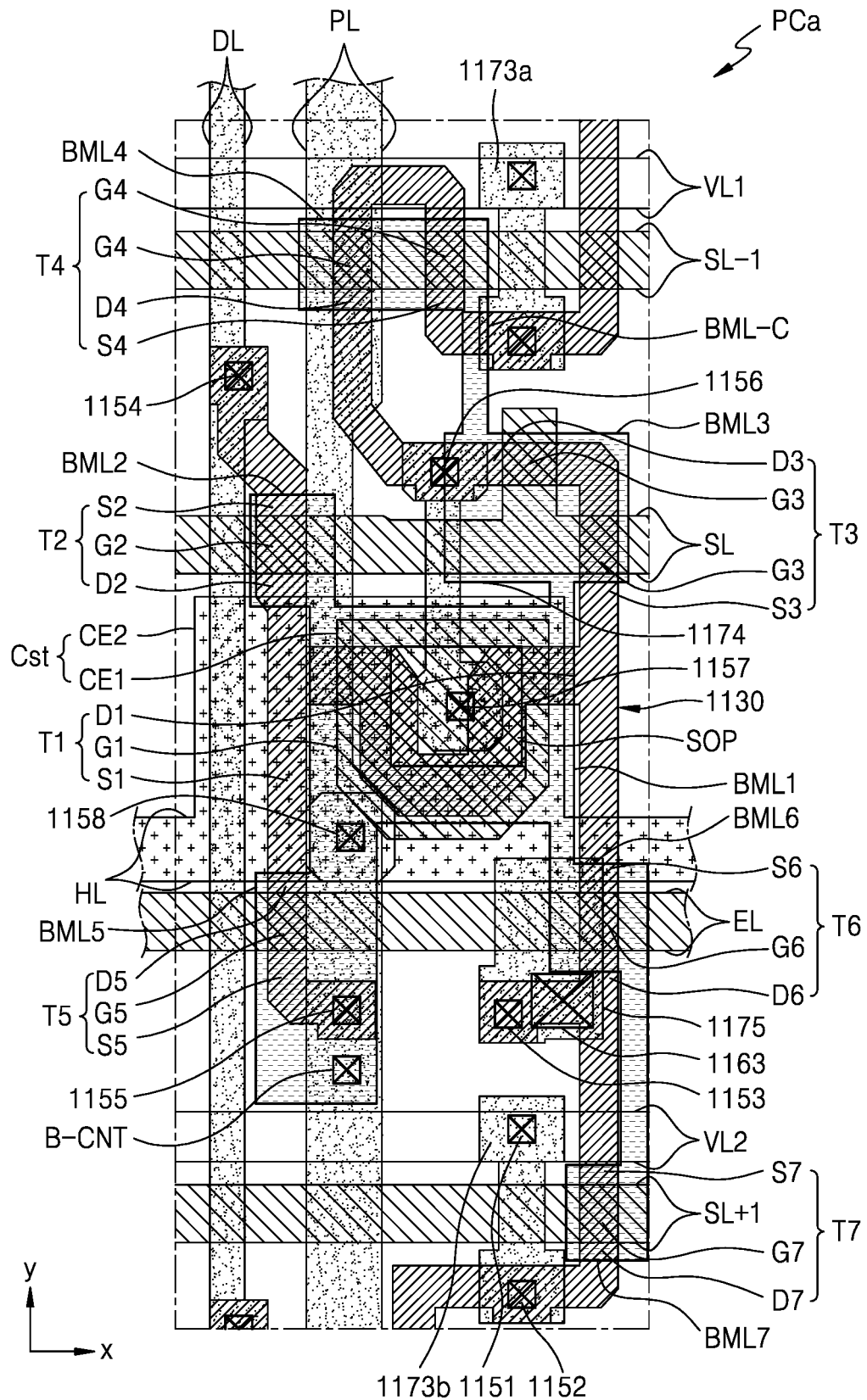
FIG. 12 is a view illustrating an arrangement of an auxiliary pixel circuit according to an embodiment.

FIG. 12 is a view illustrating an arrangement of an auxiliary pixel circuit according to an embodiment.

Referring to FIG. 12, the auxiliary pixel circuit PCa according to the illustrated embodiment may include the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. A connection relationship among the thin-film transistors T1 through T7 and functions of the thin-film transistors T1 through T7 are similar to those described with reference to FIG. 4B, and thus a description thereof may not be repeated.

In the illustrated embodiment, in the auxiliary pixel circuit PCa, the bottom metal layer BML may be patterned to overlap only the thin-film transistors T1 through T7.

In detail, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are located along a semiconductor layer 1130. The semiconductor layer 1130 may be located on a substrate on which a buffer layer made of an inorganic insulating material is formed.

Some portions of the semiconductor layer 1130 may correspond to semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In other words, the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be connected to one another in various suitable curved shapes.

The semiconductor layer 1130 may include a channel region, and a source region and a drain region on or at respective sides of the channel region. The source region and the drain region may be a source electrode and a drain electrode of a corresponding thin-film transistor. For convenience of description, the source region and the drain region are respectively referred to as a source electrode and a drain electrode.

The driving thin-film transistor T1 includes a driving gate electrode G1 overlapping a driving channel region and a driving source electrode S1 and a driving drain electrode D1 on or at respective sides of the driving channel region. The driving channel region overlapping the driving gate electrode G1 may have a curved shape such as an omega shape, to form a long channel in a narrow space. When the driving channel region is long, a driving range of a gate voltage may widen, and gradation of light emitted by an organic light-emitting diode OLED that is a light-emitting device may be better controlled, thereby improving display quality.

The switching thin-film transistor T2 includes a switching gate electrode G2 overlapping a switching channel region and a switching source electrode S2 and a switching drain electrode D2 on or at respective sides of the switching channel region. The switching drain electrode D2 may be connected to the driving source electrode S1.

The compensation thin-film transistor T3 that is a dual thin-film transistor may include compensation gate electrodes G3 overlapping two compensation channel regions, and a compensation source electrode S3 and a compensation drain electrode D3 on or at respective sides of the compensation gate electrodes G3. The compensation thin-film transistor T3 may be connected to the driving gate electrode G1 of the driving thin-film transistor T1 through a node connection line 1174.

The first initialization thin-film transistor T4 that is a dual thin-film transistor may include first initialization gate electrodes G4 overlapping two first initialization channel regions, and a first initialization source electrode S4 and a first initialization drain electrode D4 on or at respective sides of the first initialization gate electrodes G4.

The operation control thin-film transistor T5 may include an operation control gate electrode G5 overlapping an operation control channel region, and an operation control source electrode S4 and an operation control drain electrode D5 on or at respective sides of the operation control gate electrode G5. The operation control drain electrode D5 may be connected to the driving source electrode S1.

The emission control thin-film transistor T6 may include an emission control gate electrode G6 overlapping an emission control channel region, and an emission control source electrode S6 and an emission control drain electrode D6 on or at respective sides of the emission control gate electrode G6. The emission control source electrode S6 may be connected to the driving drain electrode D1.

The second initialization thin-film transistor T7 may include a second initialization gate electrode G7 overlapping a second initialization channel region, and a second initialization source electrode S7 and a second initialization drain electrode D7 on or at respective sides of the second initialization gate electrode G7.

The above thin-film transistors may be connected to the signal lines SL, SL−1, SL+1, EL, and DL, first and second initialization voltage lines VL1 and VL2, and the driving voltage line PL. The signal lines SL, SL−1, SL+1, EL, and DL, the first and second initialization voltage lines VL1 and VL2, and the driving voltage line PL may refer to (auxiliary) signal lines SL, SL−1, SL+1, EL, and DL, (auxiliary) first and second initialization voltage lines VL1 and VL2, and (auxiliary) driving voltage line PL, and the wirings may be provided separately from the main pixel circuit PCm and at least some may be shared together.

The scan line SL, the previous scan line SL−1, the emission control line EL, and the driving gate electrode G1 may be located on the semiconductor layer 1130 with insulating layers therebetween.

The scan line SL may extend in the x direction. Portions of the scan line SL may correspond to the switching and compensation gate electrodes G2 and G3. For example, portions of the scan line SL overlapping channel regions of the switching and compensation thin-film transistors T2 and T3 may respectively be the switching and compensation gate electrodes G2 and G3.

The previous scan line SL−1 may extend in the x direction, and some portions may each correspond to the first initialization gate electrode G4. For example, portions of the previous scan line SL−1 overlapping channel regions of the first initialization thin-film transistor T4 may each be the first initialization gate electrode G4.

The next scan line SL+1 may extend in the x direction, and some portions may correspond to the second initialization gate electrode G7. For example, portions of the next scan line SL+1 overlapping channel regions of the second initialization thin-film transistor T7 may each be the second initialization gate electrode G7.

The emission control line EL extends in the x direction. Some portions of the emission control line EL may respectively correspond to the operation control and emission control gate electrodes G5 and G6. For example, portions of the emission control line EL overlapping channel regions of the operation control and emission control thin-film transistors T6 and T7 may respectively be the operation control and emission control gate electrodes G5 and G6.

The driving gate electrode G1 that is a floating electrode may be connected to the compensation thin-film transistor T3 through the node connection line 1174.

An electrode voltage line HL may be located on the previous scan line SL−1, the scan line SL, the next scan line SL+1, the emission control line EL, and the driving gate electrode G1 with insulating layers therebetween.

The electrode voltage line HL may extend in the x direction to cross the data line DL and the driving voltage line PL. A part of the electrode voltage line HL may cover at least a part of the driving gate electrode G1, to form the main storage capacitor Cst along with the driving gate electrode G1. For example, the driving gate electrode G1 may serve as the lower electrode CE1 of the main storage capacitor Cst, and a part of the electrode voltage line HL may serve as the upper electrode CE2 of the main storage capacitor Cst.

The upper electrode CE2 of the main storage capacitor Cst is connected (e.g., electrically connected) to the driving voltage line PL. In this regard, the electrode voltage line HL may be connected to the driving voltage line PL located on the electrode voltage line HL through a contact hole CNT. Accordingly, the electrode voltage line HL and the driving voltage line PL may have the same voltage level (e.g., a constant voltage). For example, the electrode voltage line HL may have a constant voltage of +5 V. The electrode voltage line HL may be a horizontal driving voltage line.

Because the driving voltage line PL extends in the y direction and the electrode voltage line HL connected (e.g., electrically connected) to the driving voltage line PL extends in the x direction that crosses the y direction, a plurality of driving voltage lines PL and a plurality of electrode voltage lines HL may have a mesh structure in a display area.

The data line DL, the driving voltage line PL, first and second initialization connection lines 1173a and 1173b, and the node connection line 1174 may be located on the electrode voltage line HL with insulating layers therebetween.

The data line DL may extend in the y direction, and may be connected to the switching source electrode S2 of the switching thin-film transistor T2 through a contact hole 1154. A part of the data line DL may be a switching source electrode.

The driving voltage line PL may extend in the y direction, and is connected to the electrode voltage line HL through the contact hole CNT as described above. Also, the driving voltage line PL may be connected to the operation control thin-film transistor T5 through a contact hole 1155. The driving voltage line PL may be connected to the operation control drain electrode D5 through the contact hole 1155.

The first initialization voltage VL1 may be connected to the first initialization thin-film transistor T4 through the first initialization connection line 1173a, and the second initialization voltage line VL2 may be connected to the second initialization thin-film transistor T7 through the second initialization connection line 1173b. The first initialization voltage line VL1 and the second initialization voltage line VL2 may be connected (e.g., electrically connected) to each other by a connection member, and may have a constant voltage (e.g., −2 V).

One end of the node connection line 1174 may be connected to the compensation drain electrode D3 through a contact hole 1156, and the other end of the node connection line 1174 may be connected to the driving gate electrode G1 through a contact hole 1157. The upper electrode CE2 may have a storage opening SOP, and the contact hole 1157 may be located in the storage opening SOP.

The initialization voltage line VL may be located on the data line DL, the driving voltage line PL, the initialization connection line 1173, and the node connection line 1174 with insulating layers therebetween.

The first and second initialization voltage lines VL1 and VL2 and a pixel electrode 121 (e.g., see FIG. 11) of the organic light-emitting diode OLED may be located on or at the same layer and may include the same material. The pixel electrode may be connected to the emission control thin-film transistor T6. The pixel electrode may be connected to the connection electrode CM through a contact hole 1163, and the connection electrode CM may be connected to the emission control drain electrode D6 through a contact hole 1153. In one or more other embodiments, the first and second initialization voltage lines VL1 and VL2 and the electrode voltage line HL may be located on or at the same layer.

In the illustrated embodiment, the bottom metal layer BML may be located on the substrate 100. The bottom metal layer BML may be located between the substrate 100 and the semiconductor layer 1130. An inorganic insulating film such as a buffer layer may be located between the bottom metal layer BML and the semiconductor layer 1130.

The bottom metal layer BML may include a plurality of overlapping portions BML1 through BML7 respectively overlapping the thin-film transistors T1 through T7, and a connecting portion BML-C that connects the plurality of overlapping portions BML1 through BML7.

Although all of the plurality of overlapping portions BML1 through BML7 are connected by the connecting portion BML-C in FIG. 12, the disclosure is not limited thereto. In one or more other embodiments, the plurality of overlapping portions BML1 through BML7 may not be connected to one another but may be spaced from one another, and at least two of the overlapping portions BML1 through BML7 may be connected to each other. When all of the plurality of overlapping portions BML1 through BML7 are connected by the connecting portion BML-C as shown in FIG. 12, the same signal or the same constant voltage may be applied to the bottom metal layer BML through one contact hole B-CNT.

A constant voltage or a signal may be applied to the bottom metal layer BML. In an embodiment, the bottom metal layer BML may be connected to the driving voltage line PL through the contact hole B-CNT.

In a comparative example, when a bottom metal layer is located in a component area excluding a transmissive area, that is, when the bottom metal layer is located to correspond to an entire surface of an auxiliary pixel circuit, light incident through the transmissive area may be reflected by a component (e.g., a camera) and the reflected light may be re-reflected by the bottom metal layer and may re-enter the component, thereby resulting in ghosting in which a double image is formed on the component.

Accordingly, in the display apparatus according to an embodiment, because the bottom metal layer BML is patterned to correspond to on the thin-film transistors T1 through T7 that are portions for actually performing functions, reflected light may be prevented or substantially prevented from being re-reflected by the bottom metal layer BML and re-entering the component. Also, because light re-incident on the display panel 10 is scattered by using a pattern of the bottom metal layer BML or by using wirings of the auxiliary pixel circuit PCa from which the bottom metal layer BML is removed, reflected light may be prevented or substantially prevented from re-entering the component.

Figure 13:
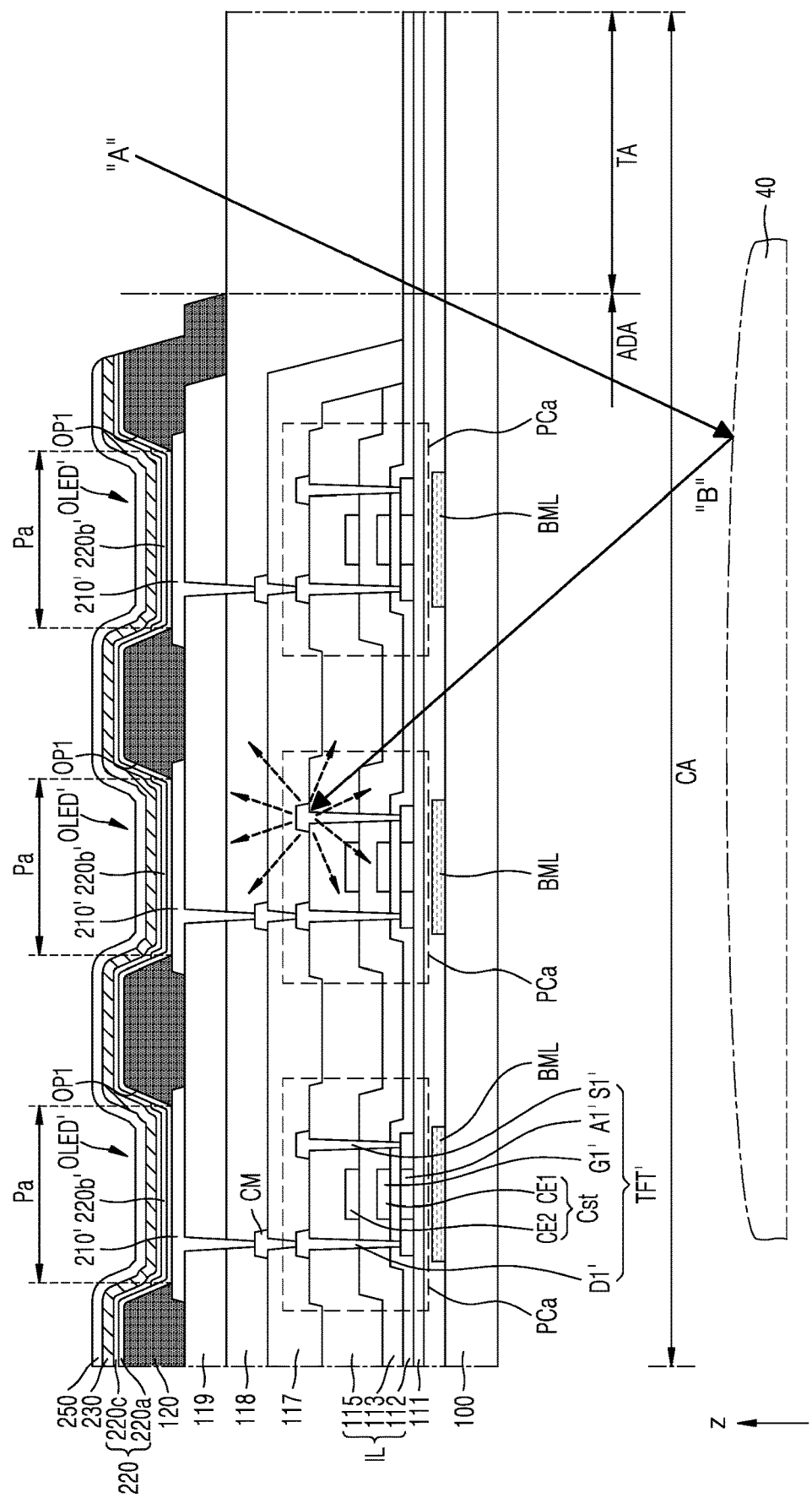
FIGS. 13 and 14 are cross-sectional views illustrating a part of a display apparatus according to an embodiment.
Figure 14:
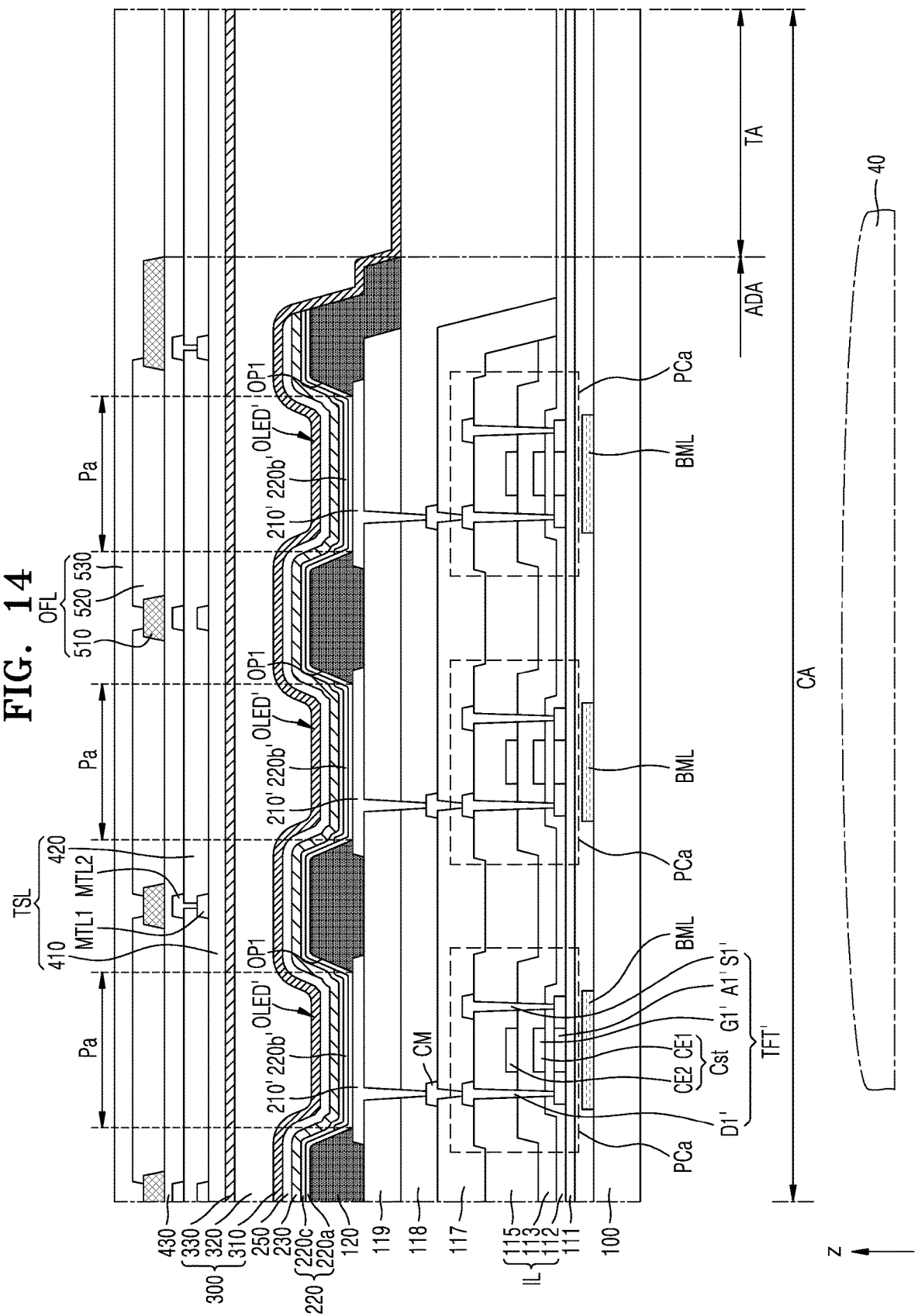

FIGS. 13 and 14 are cross-sectional views illustrating a part of a display apparatus according to an embodiment.

Referring to FIG. 13, the auxiliary sub-pixels Pa may be located in the component area CA. In the illustrated embodiment, each auxiliary sub-pixel Pa may include the auxiliary pixel circuit PCa and an auxiliary display element, that is, the auxiliary organic light-emitting diode OLED', which overlap each other. Elements of each of the auxiliary pixel circuit PCa and the auxiliary organic light-emitting diode OLED' are the same as or similar to those of FIG. 6, and thus a description of elements denoted by the same reference numerals may not be repeated. The following may primarily focus on differences.

A third planarization layer 119 may be located on the second planarization layer 118. The plurality of planarization layers 117, 118, and 119 may be provided as in the illustrated embodiment, which may lead to high integration. In an embodiment, the third planarization layer 119 may have an opening corresponding to the transmissive area TA. Although the second planarization layer 118 extends to the transmissive area TA and lower insulating layers (e.g., the first planarization layer 117, the interlayer insulating layer 115, and the second gate insulating layer 113) are not located in the transmissive area TA in FIG. 13, the disclosure is not limited thereto.

In the illustrated embodiment, a pixel-defining layer 120 may include a light-blocking material. For example, the pixel-defining layer 120 may include an insulating material (e.g., an organic insulating material) including a black pigment or a black dye. The pixel-defining layer 120 that is a light-blocking film may prevent or reduce color mixing between adjacent pixels, and may absorb light reflected by the component 40 to the display panel 10, thereby improving visibility.

Light incident on the substrate 100 through the transmissive area TA may travel along a path "A". Part of the incident light may be reflected by a surface of the component 40, and the reflected light may travel along a path "B" toward the display panel 10. In this case, the reflected light travels to the auxiliary pixel circuit PCa through an opening of the bottom metal layer BML located to correspond only to the thin-film transistor TFT, and meets a complex pattern of the auxiliary pixel circuit PCa and is scattered. In a comparative example, when a bottom metal layer is located to correspond to an entire surface of an auxiliary pixel circuit, reflected light traveling along the path "B" may be re-reflected by the bottom metal layer and may re-enter a component. The reflected light has certain noise and unintended information is input to the component, thereby reducing the reliability of information output from the component.

Accordingly, in the display apparatus 1 according to an embodiment, the reflected light traveling along the path "B" may meet or be incident on the auxiliary pixel circuit PCa and may be scattered by the bottom metal layer BML, thereby preventing or substantially preventing the reflected light from re-entering the component 40.

Referring to FIG. 14, a thin-film encapsulation layer 300 may be located on the upper layer 250. The thin-film encapsulation layer 300 may include first and second inorganic encapsulation layers 310 and 330, and an organic encapsulation layer 320 between the first and second inorganic encapsulation layers 310 and 330.

Each of the first and second inorganic encapsulation layers 310 and 330 may include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by using CVD.

The organic encapsulation layer 320 may include a polymer-based material. Examples of the polymer-based material may include an acrylic resin, an epoxy resin, polyimide, and/or polyethylene. For example, the organic encapsulation layer 320 may include an acrylic resin such as polymethyl methacrylate and/or polyacrylic acid. The organic encapsulation layer 320 may be formed by curing a monomer and/or applying a polymer.

An input sensing layer TSL may include a first conductive layer MTL1 and a second conductive layer MTL2 including a sensing electrode and/or a trace line. A first insulating layer 410 may be located between the thin-film encapsulation layer 300 and the first conductive layer MTL1, and a second insulating layer 420 may be located between the first conductive layer MTL1 and the second conductive layer MTL2.

Each of the first conductive layer MTL1 and the second conductive layer MTL2 may include a conductive material. The conductive material may include molybdenum (Mo), aluminum (Al), copper (Cu), or titanium (Ti), and may have a single layer structure or a multi-layer structure including the above material. In an embodiment, each of the first conductive layer MTL1 and the second conductive layer MTL2 may have a structure (Ti/Al/Ti) in which a titanium layer, an aluminum layer, and a titanium layer are sequentially stacked.

Each of the first insulating layer 410 and the second insulating layer 420 may include an inorganic insulating material and/or an organic insulating material. The inorganic insulating material may include silicon oxide, silicon oxynitride, or silicon nitride. The organic insulating material may include an acrylic organic material or an imide-based organic material.

The optical functional layer OFL may be located on the input sensing layer TSL. In an embodiment, the optical functional layer OFL may include an anti-reflection layer as shown in FIG. 14. The optical functional layer OFL may be located directly on the input sensing layer TSL, or may be located with a third insulating layer 430 therebetween as shown in FIG. 14.

The optical functional layer OFL may include a filter plate including a black matrix 510 and color filters 520 as shown in FIG. 14. The filter plate may include the black matrix 510 and the color filters 520 located for each pixel, and an overcoat layer 530 covering the black matrix 510 and the color filters 520.

The color filter 520 may be located in an emission area of the auxiliary sub-pixel Pa. The color filter 520 may include a red pigment or dye, a green pigment or dye, or a blue pigment or dye according to a color of light emitted by the auxiliary organic light-emitting diode OLED'.

The black matrix 510 may be located in a non-emission area and may be around (e.g., surround) the emission area. The black matrix 510 may have a through-hole formed in the transmissive area TA. In an embodiment, the black matrix 510 may overlap a touch electrode of the input sensing layer TSL. For example, as shown in FIG. 14, the second conductive layer MTL2 of the input sensing layer TSL including the touch electrode may overlap the black matrix 510. The black matrix 510 may include an insulating material (e.g., an organic insulating material) including a black pigment or a black dye.

Although the auxiliary sub-pixel Pa located in the component area CA is mainly described with reference to FIGS. 13 and 14, the structure may also be applied to the main sub-pixel Pm.

According to the one or more embodiments, a display apparatus capable of providing a high-quality image and improving the quality of an image output through a component may be provided. However, the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and equivalents thereof.

What is claimed is:

1. A display panel comprising a main display area, a component area, and a peripheral area, the display panel comprising:
    a substrate;
    a main pixel circuit and a main display element connected to the main pixel circuit, the main pixel circuit and the main display element being located on the substrate at the main display area;
    an auxiliary display element located on the substrate at the component area;
    an auxiliary pixel circuit located on the substrate at the peripheral area;
    a connection wiring connecting the auxiliary display element to the auxiliary pixel circuit; and
    a first conductive layer overlapping the auxiliary display element at the component area, the first conductive layer including a plurality of first holes.

2. The display panel of claim 1, wherein the auxiliary display element comprises an auxiliary pixel electrode, and wherein the first conductive layer is located between the substrate and the connection wiring.

3. The display panel of claim 2, wherein an orthogonal projection image of the first conductive layer onto the substrate completely overlaps the auxiliary pixel electrode.

4. The display panel of claim 2, wherein an area of the first conductive layer is equal to or less than an area of the auxiliary pixel electrode.

5. The display panel of claim 2, wherein the main pixel circuit comprises:
    a thin-film transistor comprising a semiconductor layer, a gate electrode, and an electrode layer connected to the semiconductor layer; and
    a storage capacitor comprising a lower electrode integrally formed with the gate electrode and an upper electrode located on the lower electrode,
    wherein the first conductive layer comprises a same material as a material of the gate electrode or the upper electrode.

6. The display panel of claim 5, further comprising a second conductive layer located between the substrate and the auxiliary display element at the component area, the second conductive layer including a plurality of second holes.

7. The display panel of claim 6, wherein the second conductive layer is located on the first conductive layer.

8. The display panel of claim 6, wherein the main pixel circuit comprises:
    a thin-film transistor comprising a semiconductor layer, a gate electrode, and an electrode layer connected to the semiconductor layer; and
    a storage capacitor comprising a lower electrode integrally formed with the gate electrode and an upper electrode located on the lower electrode,
    wherein the first conductive layer comprises a same material as a material of the gate electrode, and
    wherein the second conductive layer comprises a same material as a material of the upper electrode.

9. The display panel of claim 6, wherein the first conductive layer and the second conductive layer are electrically connected to each other.

10. The display panel of claim 1, wherein the first conductive layer is electrically connected to the connection wiring.

11. The display panel of claim 1, wherein a width of each of the plurality of first holes in a direction is equal to or greater than 0.5 μm.

12. The display panel of claim 1, wherein an area of the plurality of first holes is equal to or less than 50% of an area of the first conductive layer.

13. The display panel of claim 1, wherein the plurality of first holes have at least one of polygonal shapes, circular shapes, elliptical shapes, or irregular shapes, the plurality of first holes being regularly arranged.

14. The display panel of claim 1, wherein the plurality of first holes have at least one of polygonal shapes, circular shapes, elliptical shapes, or irregular shapes, the plurality of first holes being irregularly arranged.

15. The display panel of claim 1, wherein the plurality of first holes have stripe shapes extending in a direction.

16. A display panel comprising a main display area, a component area, and a peripheral area, the display panel comprising:
    a substrate;
    a main pixel circuit and a main display element connected to the main pixel circuit, the main pixel circuit and the main display element being located on the substrate at the main display area;
    an auxiliary pixel circuit and an auxiliary display element connected to the auxiliary pixel circuit, the auxiliary pixel circuit and the auxiliary display element being located on the substrate at the component area;
    a transmitter located at a side of the auxiliary pixel circuit and the auxiliary display element at the component area; and
    a bottom metal layer located between the substrate and the auxiliary pixel circuit,
    wherein the auxiliary pixel circuit comprises at least one thin-film transistor, and
    wherein the bottom metal layer is patterned to overlap the at least one thin-film transistor.

17. The display panel of claim 16, wherein the bottom metal layer overlaps only the at least one thin-film transistor.

18. The display panel of claim 16, wherein the auxiliary pixel circuit comprises a first thin-film transistor and a second thin-film transistor,
    wherein the bottom metal layer comprises overlapping portions respectively overlapping the first thin-film transistor and the second thin-film transistor, and a connecting portion connecting the overlapping portions.

19. The display panel of claim 16, wherein a signal or a constant voltage is to be applied to the bottom metal layer.

20. The display panel of claim 16, wherein the auxiliary display element comprises an auxiliary pixel electrode, and
    wherein the display panel further comprises a pixel-defining layer having an opening through which a central portion of the auxiliary pixel electrode is exposed, the pixel-defining layer comprising a light-blocking material.

21. A display apparatus comprising:
    a display panel comprising a main display area, a component area, and a peripheral area; and
    a component located under the display panel at the component area,
    wherein the display panel comprises:
    a substrate;
    a main pixel circuit and a main display element connected to the main pixel circuit, the main pixel circuit and the main display element being located on the substrate at the main display area;
    an auxiliary display element located on the substrate at the component area;
    an auxiliary pixel circuit located on the substrate at the peripheral area;
    a connection wiring connecting the auxiliary display element to the auxiliary pixel circuit; and
    a first conductive layer located between the substrate and the auxiliary display element at the component area, the first conductive layer including a plurality of first holes.

22. The display apparatus of claim 21, wherein the auxiliary display element comprises an auxiliary pixel electrode, and
    wherein the first conductive layer is located between the substrate and the auxiliary pixel electrode.

23. The display apparatus of claim 21, wherein the auxiliary display element comprises an auxiliary pixel electrode, and
    wherein an orthogonal projection image of the first conductive layer onto the substrate completely overlaps the auxiliary pixel electrode.

24. The display apparatus of claim 21, wherein the first conductive layer is electrically connected to the connection wiring.

* * * * *